US009228125B2

(12) United States Patent
Seshadri et al.

(10) Patent No.: US 9,228,125 B2
(45) Date of Patent: Jan. 5, 2016

(54) SINGLE PHASE AND FULL-COLOR PHOSPHOR

(71) Applicants: The Regents of the University of California, Oakland, CA (US); Mitsubishi Chemical Corporation, Chiyoda-ku (JP)

(72) Inventors: Ram Seshadri, Goleta, CA (US); Alexander Birkel, Darmstadt (DE); Byungchul Hong, Yokohama (JP); Jeffrey A. Gerbec, Oxnard, CA (US)

(73) Assignees: The Regents of the University of California, Oakland, CA (US); Mitsubishi Chemical Corporation, Tokyo (JP)

( * ) Notice: Subject to any disclaimer, the term of this patent is extended or adjusted under 35 U.S.C. 154(b) by 140 days.

(21) Appl. No.: 14/029,486

(22) Filed: Sep. 17, 2013

(65) Prior Publication Data
US 2015/0076539 A1 Mar. 19, 2015

(51) Int. Cl.
*C09K 11/77* (2006.01)
*H01L 33/50* (2010.01)

(52) U.S. Cl.
CPC .......... *C09K 11/7792* (2013.01); *H01L 33/502* (2013.01); *H01L 33/504* (2013.01)

(58) Field of Classification Search
CPC ............... C09K 11/08; C09K 11/7783; C09K 11/7792; H01L 33/502
USPC ......... 252/301.4 F, 301.4 R; 257/98; 313/503
See application file for complete search history.

(56) References Cited

U.S. PATENT DOCUMENTS 7,618,557 B2 * 11/2009 Daicho et al. ........... 252/301.4 F

FOREIGN PATENT DOCUMENTS

| CN | 101402860 A | * | 4/2009 |
| CN | 102173583 A | * | 9/2011 |

OTHER PUBLICATIONS

Kim et al, "Warm-white-light emitting diode utilizing a single-phase full-color Ba3MgSi2O8:Eu2+,Mn2+ phosphor", Applied Physics Letters, vol. 84, No. 15, pp. 2921-2933, Apr. 12, 2004.*
Lu et al, "Tunable Full-Color Emitting BaMg2Al6Si9O30:Eu2+, Tb3+, Mn2+ Phosphors based on Energy Trsnafe4r", Inorganic Chemisty, 50, pp. 78-46-7851, Jul. 19, 2011.*
Translation of CN 101402860 A, Apr. 2009.*
Translation of CN 102173583 A, Sep. 2011.*
Schubert, E.F., et al., "Solid-State Light Sources Getting Smart", Science, May 27, 2005, pp. 1274-1278, vol. 308.
Chambers, M.D., et al., "Doped Oxides for High-Temperature Luminescence and Lifetime Thermometry", Annual Review Mater. Res., 2009, pp. 325-359, vol. 39.
Pimputkar, S., et al., "Prospects for LED lighting", Nature Photonics, Apr. 2009, pp. 180-182, vol. 3.
Ye, S., et al., "Phosphors in phosphor-converted white light-emitting diodes: Recent advances in materials, techniques and properties", Materials Science and Engineering R, 2010, pp. 1-34, vol. 71.
Smet, P., et al., "Selecting Conversion Phosphors for White Light-Emitting Diodes", Journal of the Electrochemical Society, 2011, pp. R37-R54, vol. 158, No. 6.
George, N., et al., "Phosphors for Solid-State White Lighting", Annual Review Mat. Res., 2013, pp. 481-501, vol. 43.
Im, W.B., et al., "A yellow-emitting Ce3+ phosphor, La1-xCexSr2AlO5, for white light-emitting diodes", Applied Physics Letters, 2008, pp. 091905-1-091905-3, vol. 93.
Im, W.B., et al., "Substitution of oxygen by fluorine in the GdSr2AlO5:Ce3+ phosphors: Gd1-xSr2+xAlO5-xFx solid solutions for solid state white lighting", Optics Express, 2009, pp. 22673-22679, vol. 17, No. 25.
Im, W.B., et al., "Probing local structure in the yellow phosphor LaSr2AlO5 : Ce3+, by the maximum entropy method and pair distribution function analysis", Journal of Materials Chemistry, 2009, pp. 8761-8766, vol. 19.
Im, W.B. et al. "La1-x-0.025Ce0.025Sr2+xAl1-xSixO5 solid solutions as tunable yellow phosphors for solid state white lighting", Journal of Materials Chemistry, 2009, pp. 1325-1330, vol. 19.
Lu, W., et al., "Tunable Full-Color Emitting BaMg2Al6Si9O30:Eu2+, Tb3+, Mn2+ Phosphors Based on Energy Transfer", Inorganic Chemistry, 2011, pp. 7846-7851, vol. 50.
Kim, J.S., et al., "Warm-white-light emitting diode utilizing a single-phase full-color Ba3MgSi2O8:Eu2+, Mn2+ phosphor", Applied Physics Letters, 2004, pp. 2931-2933, vol. 84, No. 15.
Birkel, A., et al., "Eu2+—doped M2SiO4 (M=Ca, Ba) phosphors prepared by a rapid microwave-assisted sol-gel method: Phase formation and optical properties", Solid State Sciences, 2013, pp. 51-57, vol. 19.
Birkel, C.S., "Rapid Microwave Preparation of Thermoelectric TiNiSn and TiCoSb Half-Heusler Compounds", Chemistry of Materials, 2012, pp. 2558-2565, vol. 24., ACS Publications.
Daldosso, M., et al., "Synthesis, EXAFS investigation and optical spectroscopy of nanocrystalline Gd3Ga5O12 doped with Ln3+ ions (Ln=Eu, Pr)", Optical Materials, 2008, pp. 1162-1167, vol. 30.
Dorenbos, P., "Energy of the first 4f7→ 4f65d transition of Eu2+ in inorganic compounds", Journal of Luminescence, 2003, pp. 239-260, vol. 104.
Dorenbos, P., "The 4fn <—>4fn-1 5 d transitions of the trivalent lanthanides in halogenides and chalcogenides", Journal of Luminescence, 2000, pp. 91-106, vol. 91.
Poort, S.H.M., et al., "Lifetime Measurements in Eu2+—Doped Host Lattices", J. Phys. Chem Solids, 1997, pp. 1451-1456, vol. 58, No. 9.
Im, W.B., et al., "Luminescent and Structural Properties of (Sr1-X,Bax)3MgSi2O8:Eu2+: Effects of Ba Content on the Eu2+ Site Preference for Thermal Stability", Inorganic Chemistry, 2009, pp. 557-564, vol. 48, No. 2.

(Continued)

*Primary Examiner* — Carol M Koslow
(74) *Attorney, Agent, or Firm* — Gates & Cooper LLP

(57) ABSTRACT

A composition of matter including a phosphor having an emission peak in each of a blue, green, and red color region of the Electromagnetic spectrum, wherein the phosphor is excitable by light having a wavelength between 350 nanometers (nm) and 420 nm.

20 Claims, 8 Drawing Sheets

(56) References Cited

OTHER PUBLICATIONS

Park, C-H., et al., "Superstructure of a phosphor material Ba3MgSi2O8 determined by neutron diffraction data", Journal of Solid State Chemistry, 2009, pp. 496-501, vol. 182.
Kim, J.S., et al., "Full-color Ba3MgSi2O8:Eu2+, Mn2+ phosphors for white-light-emitting diodes", Solid State Communications, 2005, pp. 21-24, vol. 135.
Klasens, H.A., et al., "Ultraviolet Fluorescence of Some Ternary Silicates Activated with Lead", Journal of the Electrochemical Society, Feb. 1957, pp. 93-100.
Rack, P.D., et al., "The structure, device physics, and material properties of thin film electroluminescent displays", Materials Science and Engineering, 1998, pp. 171-219, vol. R21.
Kim, J.S., et al., "Luminescent and thermal properties of full-color emitting X3MgSi2O8:Eu2+, Mn2+ (X=Ba, Sr, Ca) phosphors for white LED", Journal of Luminescence, 2007, pp. 583-586, vol. 122-123.
Ma, L., et al., "Investigation of Eu—Mn energy transfer in A3MgSi2O8:Eu2+, Mn2+(A=Ca, Sr, Ba) for light-emitting diodes for plant cultivation", Applied Physics Letters, 2008, pp. 144101-1-144101-3, vol. 93.
Aitasalo, T., et al., "Crystal Structure of the Ba3MgSi2O8:Mn2+, Eu2+ phosphor for white light emitting diodes", Z. Kristallogr. Suppl., 2007, pp. 461-466, vol. 26.
Yonesaki, Y., et al., "Crystal structure of Eu2+—doped M3MgSi2O8 (M: Ba, Sr, Ca) compounds and their emission properties", Journal of Solid State Chemistry, 2009, pp. 547-554, vol. 182.
Roy, R., et al., "Controlled Microwave Heating and Melting of Gels", J. Am. Ceram. Soc., 1985, pp. 392-395, vol. 68, No. 7.
Wang, D-J., et al., "Green Light-Emitting Phases Induced by Al Addition in Full-Color Ba3MgSi2O8:Eu2+, Mn2+ Phosphor for White-Light-Emitting Diodes", Electrochemical and Solid-State Letters, 2009, pp. H179-H181, vol. 12, No. 5.
Ma, L., et al,. "The Origin of 505 nm-Peaked Photoluminescence from Ba3MgSi2O8:Eu2+, Mn2+ Phosphor for White-Light-Emitting Diodes", Electrochemical and Solid-State Letters, 2008, pp. E1-E4, vol. 11, No. 2.
Dorenbos, P., "Thermal quenching of Eu2+ 5d-4f luminescence in inorganic compounds", Journal of Physics: Condensed Matter, 2005, pp. 8103-8111, vol. 17.
Paulose, P.I., et al., "Sensitized fluorescence of Ce3+/Mn2+ system in phosphate glass", Journal of Physics and Chemistry of Solids, 2003, pp. 841-846, vol. 64.
Dorenbos, P., "Relation between Eu2+ and Ce3+ f<—>d-transition energies in inorganic compounds", Journal of Physics: Condensed Matter, 2003, pp. 4797-4807, vol. 15.
Le Bail, A., et al., "Ab-Initio Structure Determination of LiSbWO6 by X-ray Powder Diffraction", Mat. Res. Bull., 1988, pp. 447-452, vol. 23.
Greenham, N.C., et al., "Measurement of absolute photoluminescence quantum efficiencies in conjugated polymers", Chemical Physics Letters, 1995, pp. 89-96, vol. 241.
Birkel, A., et al., "Microwave assisted preparation of Eu2+—doped Akermanite Ca2MgSi2O7", Solid State Sciences, 2012, pp. 739-745, vol. 14.
Biswas, K., et al., "Rapid microwave synthesis of indium filled skutterudites: An energy efficient route to high performance thermoelectric materials", Materials Research Bulletin, 2011, pp. 2288-2290, vol. 46.
Chen, H-Y., et al., "Preparation of Sr2SiO4:Eu3+ phosphors by microwave-assisted sintering and their luminescent properties", Ceramics International, 2012, pp. 125-130, vol. 38.
Bachmann, V., et al., Temperature Quenching of Yellow Ce3+ Luminescence in YAG:Ce, Chem. Mater., 2009, pp. 2077-2084, vol. 21.
Blasse, G., et al., "Fluorescence of Eu2+—Activated Silicates", Philips Res. Repts., 1968, pp. 189-200, vol. 23.
Birkel, A., et al., "Rapid Microwave Preparation of Highly Efficient Ce3+—Substituted Garnet Phosphors for Solid State White Lighting", Chemistry of Materials, 2012, pp. 1198-1204, vol. 24.
Barry, T., "Equilibria and Eu2+ Luminescence of Subsolidus Phases Bounded by Ba3MgSi2O8, Sr3MgSi2O8, and Ca3MgSi2O8", J. Electrochem. Soc.: Solid State Science, Jul. 1968, pp. 733-738, vol. 115.
Baghurst, D.R., et al., "Microwave syntheses for superconducting ceramics", Nature, Mar. 1988, p. 311, vol. 332.
Blasse, G., et al., "Luminescent Materials", Springer: Berlin, Heidelberg, New York, 1994, Title page, copyright page and table of contents.
Ishigaki, T., et al., "Microwave synthesis technique for long phosphorescence phosphor SrAl2O4:Eu2+,Dy3+ using carbon reduction", Materials Science and Engineering, 2010, pp. 109-112, vol. B173.
Becker, W., "Advanced Time-Correlated Single Photon Counting Techniques", Springer Series in Chemical Physics, 2005, vol. 81, Springer: Berlin, Heidelberg, New York, Title page and Table of contents.
Kim, J.S., et al., "Emission color variation of M2SiO4:Eu2+ (M=Ba, Sr, Ca) phosphors for light-emitting diode", Solid State Communications, 2005, pp. 187-190, vol. 133.
Dorenbos, P., et al., "4f-5d spectroscopy of Ce3+ in CaBPO5, LiCaPO4 and Li2CaSiO4", Journal of Physics: Condensed Matter, 2003, pp. 511-520, vol. 15.
Dorenbos, P., "Systematic behaviour in trivalent lanthanide charge transfer energies", Journal of Physics: Condensed Matter, 2003, pp. 8417-8434, vol. 15.
Dorenbos, P., "The 5d level positions of the trivalent lanthanides in inorganic compounds", Journal of Luminescence, 2000, pp. 155-176, vol. 91.
Dorenbos, P., et al., "5d-level energies of Ce3+ and the crystalline environment. I. Fluoride compounds", Physical Review B., Dec. 2000, pp. 15640-14649, vol. 62, No. 23.
Dorenbos, P., et al., "Calculation of the energy of the 5d barycenter of La3F3[Si3O9]:Ce3+", Journal of Luminescence, 2003, pp. 117-119, vol. 105.
Moore, P.B., et al., "Atomic Arrangement of Merwinite, Ca3Mg[SiO4]2, An Unusual Dense-Packed Structure of Geophysical Interest", American Mineralogist, 1972, pp. 1355-1374, vol. 57.
Kim, J.S., et al., "Temperature-dependent emission spectra of M2SiO4:Eu2+ (M=Ca, Sr, Ba) phosphors for green and greenish white LEDs", Solid State Communications, 2005, pp. 445-448, vol. 133.

* cited by examiner

SINGLE PHASE AND FULL-COLOR PHOSPHOR

BACKGROUND OF THE INVENTION

1. Field of the Invention

The present invention relates to inorganic phosphors that produce full-spectrum down-converted white-light in the presence of a semiconducting element.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

Solid-state lighting based on phosphor-converted light-emitting diodes (pc-LEDs) is bound to replace low-efficiency incandescent as well as mercury-containing fluorescent light sources due to the promise of lower energy consumption and longer lifetimes [1-6]. Among the many classes of materials that have recently been investigated for potential lighting applications, a significant amount of the work on oxide hosts is carried out on aluminates[7-9], aluminosilicates[10,11] and silicates [12,13].

In order to replace inefficient incandescent lighting, much effort has been spent to develop new materials that show higher efficiencies and better (long-term) stability compared to incandescent light bulbs and also compact fluorescent lamps (CFL). Therefore, white light generation based on solid-state devices is considered a promising alternative due to efficiency gains as well as longer lifetimes and eventually lower operating costs. Potentially, there are several different ways to create white light by solid-state means: (i) by employing a red, green and blue light-emitting diode (LED), (ii), using a blue LED that excites a luminescent material (a phosphor) that down-converts part of the blue light to yellow-green radiation or (iii) by utilizing a (near)-UV LED with an emission wavelength of about 350-400 nm that subsequently excites one or more phosphors that then create the desired white light. Due to some inherent and technical limitations, most solid-state lighting devices are based on the latter two mechanisms; because of the involvement of a down-converting material, usually they are referred to as phosphor-converted light-emitting diodes (pc-LEDs).

Evolution of the pc-LED originated with a yellow emitting phosphor cerium-doped yttrium aluminum garnet ($Y_{3-x}Ce_xAl_5O_{12}$) potted on a blue emitting semiconducting element. A combination of "yellow" photoluminescence with "blue" electroluminescence produces a composite white light (yellow-green). The composite white light typically has poor color quality and cool color temperature, exhibiting a spectral maximum around 550 nm. Due to the lack of a red component in the emission spectrum, the white light appears blue-ish to the human eye and is therefore considered "cold" white light.

Improvements to the next generation of the pc-LED focused on improving the color quality by introducing a secondary phosphor to manipulate the color coordinates, improving the color rendering and temperatures. Relying on a mixture of red emitting and green emitting phosphors potted on a blue semiconducting element, the composite white light can now be manipulated by controlling the intensity of each emitting primary color (red, blue and green) exhibiting a spectral maximum ranging from 525 nanometers (nm) to 680 (nm). While gains were made on the quality side, new engineering considerations were revealed on the efficiency side; namely internal reabsorption of green photoluminescence by the red emitting phosphor and scattering of the lower wavelength photons.

Further improvements to color quality and control over color temperature has resulted in a three component phosphor blend; red emitting, blue emitting, and green emitting phosphors potted on a near-ultraviolet (UV) semiconducting element.

A more efficient approach to pc-LED architecture is to have a single component phosphor emitting full-spectrum photoluminescent white light through excitation by a near-UV semiconducting element. Potential advantages of single-phase materials over blending materials together is the potentially better stability (both chemically as well as in terms of color) as well as the absence of reabsorption of parts of the emitted light from the green and red components of the phosphor blend. This can eventually lead to better luminous efficiency as well as better color rendering index, $R_a$.

Within the silicates, $Ba_3MgSi_2O_8$ has been the focus of much research effort since the late 1960's [14,15], mostly due to its very good thermal stability, high quantum yield, abundant constituent elements and the potential for full-color emission. Phosphors based upon $Ba_3MgSi_2O_8$ co-activated with $Eu^{2+}$ and $Mn^{2+}$ emitting blue and red light have been studied extensively. However, after four decades of research, no true full-color emitting phosphor based on $Ba_3MgSi_2O_8$ has been reported. Earlier reports of tri-band (i.e. blue, green and red) luminescence [12,16,17] from $Eu^{2+}$ and $Mn^{2+}$ co-activated samples have been demonstrated, resulting from significant amounts of orthosilicate ($Ba_2SiO_4$) impurities, which exhibits the observed broad and very efficient emission band centered around 505 nm [18,19].

The elucidation of the structure of $Ba_3MgSi_2O_8$ has also been in the center of much discussion. Originally described as iso-structural to the calcium analogue Merwinite ($Ca_3MgSi_2O_8$) by Klasens et al. [20], it has later been found to be closely related to the Glaserite structure type of $K_3Na(SO_4)2$ [19,21]. Recently, Park et al. [22] have used a combined neutron and X-ray diffraction study to determine the true unit cell. It was found that $Ba_3MgSi_2O_8$ crystallizes in a trigonal space group P-3 (space group 147) with the cell parameters being a,b=9.72411 Å and c=7.27647 Å.

As for most oxide phosphors, the preparation usually relies on the treatment of intimate mixtures of solid precursors in high temperature furnaces, often under reducing atmospheres to stabilize the desired valence state of the dopant ions (such as $Eu^{2+}$ and $Ce^{3+}$). Microwave-assisted preparations, reported as early as in the 1980s [23,24], offer a very rapid and energy efficient alternative to more classical pathways. Recently, several different materials could be prepared employing microwave-assisted solid-state pathways, such as Skutterudites [25], intermetallics [26] and oxide phosphors [27-30].

SUMMARY OF THE INVENTION

One or more embodiments of the invention disclose a composition of matter, comprising: a phosphor having an emission peak in each of a blue, green, and red color region of the Electromagnetic (EM) spectrum, wherein the phosphor is excitable by light having a wavelength between 350 nanometers (nm) and 420 nm, or the phosphor is excitable by light having a peak intensity at a wavelength between 350 nm and 420 nm.

The composition of matter can have a blue emission peak at a wavelength between 430 nm and 470 nm, a green emission peak at a wavelength between 520 nm and 560 nm, and a red emission peak at a wavelength between 600 nm and 660 nm.

The composition of matter can comprise a crystal phase having a chemical composition represented by the formula $M^1_{a-x-y}Eu_xTb_yM^2_{b-c-z}M^3_cMn_zM^4_{d-e}M^5_eO_f$, wherein: $M^1$ is at least one metal element selected from Calcium (Ca), Strontium (Sr) and Barium (Ba), $M^2$ is Magnesium (Mg), $M^3$ is at least one metal element selected from Lithium (Li) and Sodium (Na), $M^4$ is at least one element selected from the group 14 of the Periodic table, $M^5$ is at least one element selected from the group 13 of the Periodic table, and $2.7 \le a \le 3.3$, $0.7 \le b \le 1.3$, $0 < c \le 1.0$, $1.7 \le d \le 2.3$, $0 \le e \le 1.0$, $7.7 \le f \le 8.3$, $0 < x < 0.3$, and $0 < y < 0.9$, $0 < z < 0.4$.

$M^1$ can be Ba, $M^3$ can be Li, and $M^4$ can be Si, for example.

The phosphor can comprise a single phase crystal doped with at least three dopants and comprising one or more charge balancing members surrounding one or more of the dopants, wherein the charge balancing members split the crystal's electric or ligand field experienced by the dopants, such that the dopants have an emission peak in each of the blue, green, and red color region when the phosphor is excited by light. Relative amounts of each of the dopants, wherein radiative interactions between the dopants are suppressed such that the emission peak has a color temperature.

The phosphor can be barium magnesium silicate, strontium magnesium silicate, or calcium magnesium silicate, doped with Europium (Er), Terbium (Tb), and Manganese (Mn), and further comprising lithium (Li) or sodium (Na) for charge balancing of the dopants.

The dopants can include a concentration of $Eu^{2+}$ of 1 to 3 mol %, a terbium $Tb^{3+}$ concentration of 8 to 12 mol %, and an $Mn^{2+}$ concentration in a range of 2-3%.

The dopants can include a concentration of $Eu^{2+}$ of 0.1 to 5 mol %, a terbium $Tb^{3+}$ concentration of 0.1 to 15 mol %, and an $Mn^{2+}$ concentration in a range of 0.1 to 5 mol %.

The phosphor can emit light (e.g., white light) having a color temperature, e.g., a color temperature between 2500 Kelvin (K) and 20000 Kelvin. For example, a dopant content of Eu, Tb and Mn can be selected wherein the color temperature is between 2500 Kelvin and 20000 Kelvin.

A relative amount of dopants in the phosphor can be such that the color co-ordinate of the emission peak is no more than ($\Delta x=0.01$, $\Delta y=0.1$) from a color coordinate of (x=0.33, y=0.33) or from the Plankian locus.

The present invention further discloses a method of fabricating a phosphor, comprising mixing raw materials in liquid form, in solution, or in a sol-gel form; and heating the mixed raw materials, including heating by microwave, under conditions to make a phosphor having an emission peak in each of a blue, green, and red color region of the EM spectrum, wherein the phosphor is excitable by light having a wavelength between 350 nm and 420 nm or the phosphor is excitable by light having a peak intensity at a wavelength between 350 nm and 420 nm. In one example, the present invention discloses a rapid and energy-efficient microwave-assisted approach to prepare a single-phase full-color phosphor, based on $Ba_3MgSi_2O_8$.

In one or more embodiments, the samples were prepared using a citric acid based sol-gel preparation pathway with the microwave-assisted heating step. This reduces the time required for the final heat treatment to less than 30 minutes.

The mixing and heating can be such that the emission peak has a color temperature between 2500 Kelvin and 20000 Kelvin. The method can include selecting the Eu, Tb and Mn contents to control the color temperature between 2500 Kelvin and 20000 Kelvin. The mixing can comprise incorporating relative amounts of dopants and one or more charge balancing members; and the heating can comprise heating the mixed raw materials under conditions, wherein the mixing and heating can be such that the mixed raw materials crystallize into the phosphor having a single phase, the charge balancing members split the phosphor's electric or ligand field experienced by the dopants such that the dopants have an emission peak in each of the blue, green, and red color region when the phosphor is excited by the light, and the relative amounts suppress radiative interactions between the dopants such that the emission peak has a color temperature. The mixed raw materials can be mixed in sol-gel form and the charge balancing members can be Lithium ions. The heating and mixing can be such that the phosphor comprises a crystal phase having a chemical composition represented by the formula $M^1_{a-x-y}Eu_xTb_yM^2_{b-c-z}M^3_cMn_zM^4_{d-e}M^5_eO_f$ as discussed above.

The present invention further discloses a semiconductor light emitting device, comprising a solid state light emitting device to emit light in an ultraviolet region; and a phosphor optically coupled to the solid state light emitting device, wherein the phosphor comprises a full color emitting phosphor having an emission peak in each of a blue, green, and red color region of the Electromagnetic (EM) spectrum, when excited by the solid state light emitting device.

The structural properties of the obtained luminescent materials have been thoroughly investigated by means of (synchrotron) X-ray powder diffraction and Rietveld analyses. The morphology and elemental composition was elucidated using scanning electron microscopy and energy-dispersive X-ray spectroscopy. In order to study the optical behavior, the excitation and emission spectra were recorded. Full-color emission is achieved using $Eu^{2+}$ (blue), $Tb^{3+}$ (green) and $Mn^{2+}$ (red) as the activator ions. The thermal robustness of the emission was investigated using temperature-dependent luminescence spectroscopy. The energy-transfer processes within the samples were studied using time-dependent spectroscopy and the quantum yield in dependence of the composition was determined

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

I. Materials and Methods

Figure 1:
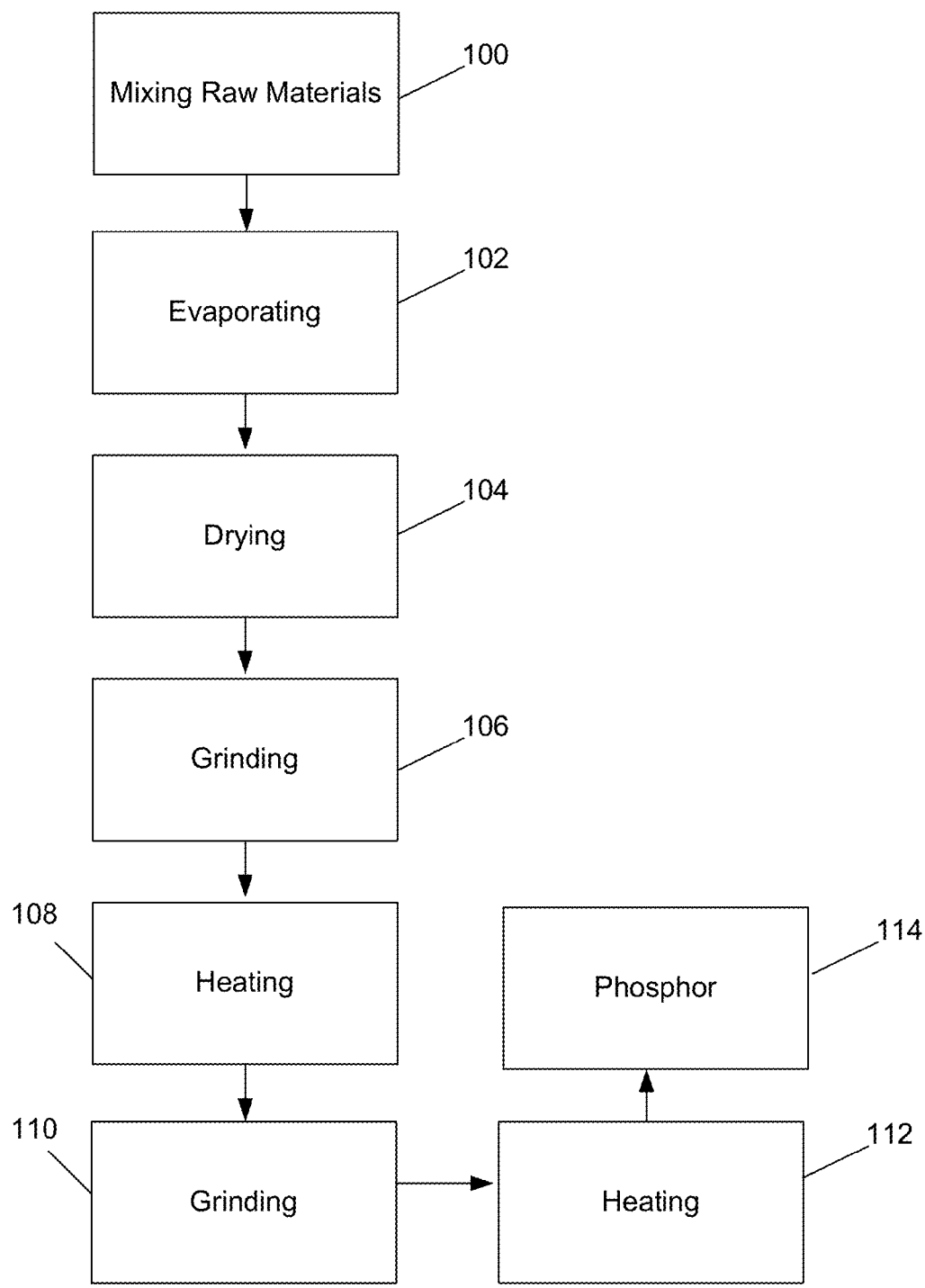
FIG. 1 is a flowchart illustrating a method of fabricating a phosphor, according to one or more embodiments.

FIG. 1 is a flowchart illustrating a method of fabricating a phosphor. The method can comprise the following steps.

Block 100 represents mixing raw materials in liquid form, in solution, or in a sol-gel form. The mixing can comprise incorporating components of a host crystal, relative amounts of dopants, and including one or more charge balancing members.

Blocks 102-108 represent one or more intermediate steps such as evaporating (102), drying (104), grinding (106), heating (108), and re-grinding (110) the mixed raw materials.

Block 112 represents heating the mixed raw materials after the intermediate steps and/or mixing step 100, including heating by microwave (e.g., under reducing atmosphere) using a microwave apparatus. The heating time can be less than 30 minutes.

Figure 2:
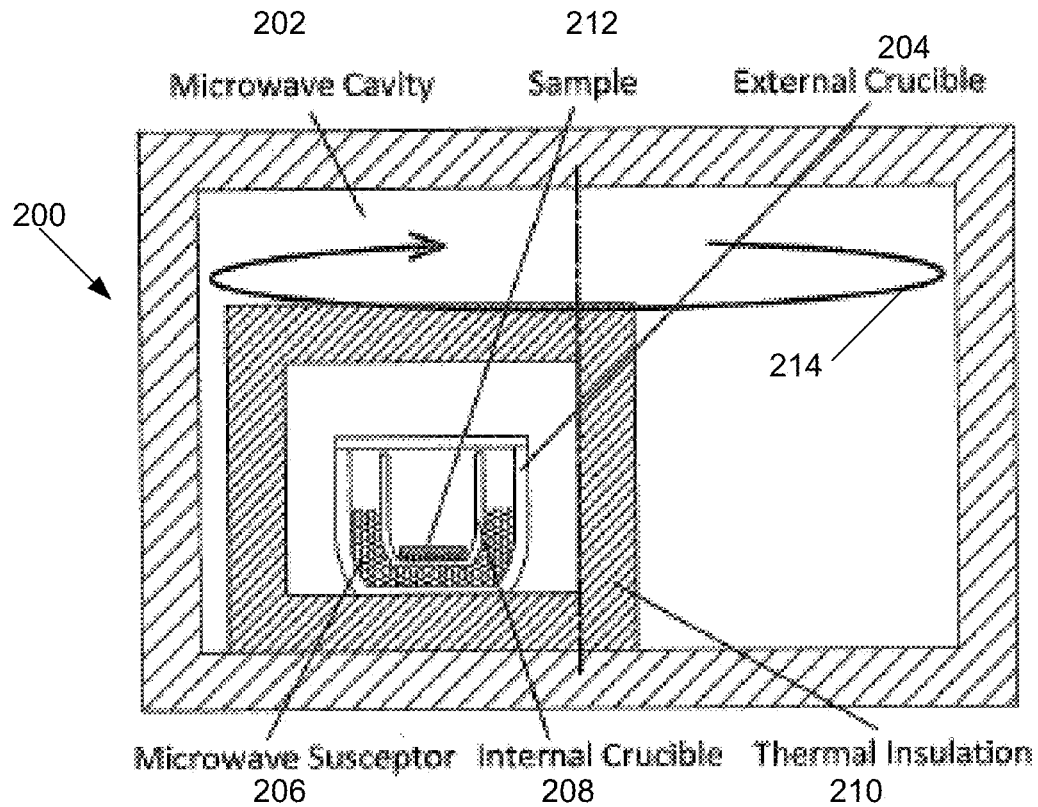
FIG. 2 is a cross-sectional diagram of a microwave set up, taken from [28].

FIG. 2 illustrates the apparatus used to perform the heating by microwave, comprising a Panasonic 1300 Watt microwave 200 having a microwave cavity 202 and modified to include an external crucible 204, microwave susceptor 206, internal crucible 208, thermal insulation 210, wherein the sample 212 (mixed raw materials) are placed in the internal crucible 208 and the sample is stirred 214 by stirring means (e.g., lazy susan) during the heating. Other microwave heating devices can also be used.

Carbon when heated in air will produce $CO_2$ and CO gases. An unlimited supply of oxygen will make $CO_2$, if oxygen is limited, then CO will be produced. In one or more embodiments of the present invention, the carbon is placed inside the microwave reactor (separated from the phosphor precursor). When the sample temperature exceeds 600 Celsius (° C.), $CO_2$ is produced as the major constituent headspace gas—this provides a convenient reducing atmosphere (however, when chemical equilibrium is reached there will always be some CO, especially when it's used up in a reducing reaction).

It was also found that conventional food microwave ovens containing magnetrons with variable power outputs were more effective than ovens having magnetrons with duty cycles (i.e. 100% power all the time with bursts of on/off). Furthermore, conventional food ovens are multimode meaning the microwaves are scattered about randomly in the cavity. This is why the sample placement is off-center. When the lazy susan spins, the sample on the lazy susan sweeps across the entire cavity which effectively normalizes hot spots where there is a high concentration of microwaves.

Block 114 represents the end result, a composition of matter comprising a phosphor.

The mixing, intermediate steps, and heating can be under conditions to make a phosphor wherein the phosphor has an emission peak in each of a blue, green, and red color region of the EM spectrum and wherein the phosphor is excitable by light or radiation (e.g., having a wavelength between 350 nanometers (nm) and 420 nm) or wherein the phosphor is excitable by light having a peak intensity at a wavelength (peak emission wavelength) between 350 nm and 420 nm.

The phosphor can have a blue emission peak at a wavelength between 430 nm and 470 nm, a green emission peak at a wavelength between 520 nm and 560 nm, and a red emission peak at a wavelength between 600 nm and 660 nm.

The mixing 100 and heating 112 can be such that the phosphor emits an emission peak or light (e.g., white light or homogenous white light) having a color temperature (e.g., a color temperature between 2500 Kelvin and 20000 Kelvin). A relative amount of dopants in the phosphor can be such that the color co-ordinate of the emission peak or white light emitted by the phosphor is no more than ($\Delta x=0.01$, $\Delta y=0.1$) from a color coordinate of ($x=0.33$, $y=0.33$) or Plankian locus.

The method can comprise selecting the dopants comprising Eu, Tb and Mn, and selecting the contents of the dopants Eu, Tb, and Mn, wherein the color temperature is controlled between 2500 Kelvin (K) and 20000 Kelvin.

The incorporating of dopants, the including of charge balancing elements, and the heating can be under conditions (e.g., synthesis conditions) wherein the mixed raw materials crystallize into the phosphor comprising a single phase crystal doped with at least three dopants (e.g., Eu$^{2+}$, Tb$^{3+}$, Mn$^{2+}$) and comprising one or more charge balancing members (e.g., Li$^+$, Na$^+$) surrounding one or more of the dopants. The charge balancing members split the phosphor's electric or ligand field experienced by the dopants such that the dopants have an emission peak in each of the blue, green, and red color region, when the phosphor is excited by light having the wavelength between 350 nm and 420 nm, and the relative amounts of each of the dopants suppress radiative interactions between the dopants such that the emission peak has a color temperature between (e.g., between 2500 Kelvin and 20000 Kelvin).

The crystal can comprise host members (e.g., (M=Ba, Sr, or Ca), Mg, a group 14 element such as Si, and O, disposed at sites in a host crystal lattice; at least three different dopant members (e.g., Eu$^{2+}$, Tb$^{3+}$, Mn$^{2+}$) each at least partially substituting one of the host members (typically the M) at three different sites of the host crystal lattice; and one or more charge balancing members (e.g., Li$^+$, Na$^+$) at least partially substituting one of the host members (typically the Mg or M) at one of the sites of the host crystal lattice.

The mixing and heating can be such that the phosphor comprises a crystal phase having a chemical composition represented by the formula:
$M^1_{a-x-y}Eu_xTb_yM^2_{b-c-z}M^3_cMn_zM^4_{d-e}M^5_eO_f$, wherein $M^1$ is at least one metal element selected from Ca, Sr and Ba, $M^2$ is Mg, $M^3$ is at least one metal element selected from Li and Na, $M^4$ is at least one element selected from the group 14 of the Periodic table, $M^5$ is at least one element selected from the group 13 of the Periodic table, and $2.7 \leq a \leq 3.3$, $0.7 \leq b \leq 1.3$, $0 < c \leq 1.0$, $1.7 \leq d \leq 2.3$, $0 \leq e \leq 1.0$, $7.7 \leq f \leq 8.3$, $0 < x < 0.3$, $0 < y < 0.9$, and $0 < z < 0.4$.

$M^1$ can be Ba, $M^3$ can be Li, and $M^4$ can be Si, for example.

The phosphor can be barium magnesium silicate, strontium magnesium silicate, or calcium magnesium silicate, the phosphor can be doped with Europium, Terbium, and Manganese, and the phosphor can further comprise lithium (Li) or sodium (Na) for charge balancing the dopants.

The mixed raw materials can be mixed in sol-gel form and the charge balancing members can be Lithium ions. In one embodiment, the combination of a sol-gel with Li as the charge-balancing ion and microwave heating produced a single phase phosphor with sufficient purity to obtain the color temperature between 2500 Kelvin and 20000 Kelvin (e.g., 9000K). This range of color temperature (2500 K-20000 K) is in the general region of utility for both illumination and display systems. Furthermore, the color temperature can be controlled with different Eu, Tb and Mn contents.

For example, the dopants can include a concentration of $Eu^{2+}$ of 1 to 3 mol %, a terbium $Tb^{3+}$ concentration of 8 to 12 mol %, and an $Mn^{2+}$ concentration in a range of 2-3 mol %. In another example, the dopants include a concentration of $Eu^{2+}$ of 0.1 to 5 mol %, a terbium $Tb^{3+}$ concentration of 0.1 to 15 mol %, and an $Mn^{2+}$ concentration in a range of 0.1 to 5 mol %.

The composition of matter can comprise a powder comprising an aggregation of the single crystal phosphors.

Figure 3:
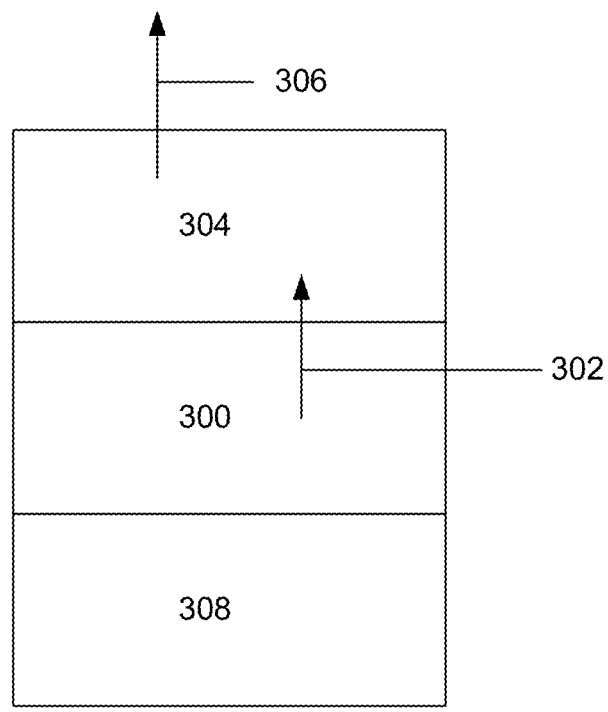
FIG. 3 is a cross-sectional diagram of a white light source according to one or more embodiments.

FIG. 3 illustrates a semiconductor light emitting device, comprising a solid state light emitting device 300 (e.g., light emitting diode or laser diode) to emit light 302 (e.g., in an Ultraviolet region); and a phosphor 304 optically coupled to the solid state light emitting device 300, wherein the phosphor 304 comprises a full color emitting phosphor (e.g., fabricated according to FIG. 1) emitting light 306 having an emission peak in each of a blue, green, and red color region of the EM spectrum when excited by the light 302 from the solid state light emitting device 300.

FIG. 3 further illustrates an example where the phosphor 304 can be thermally coupled to, or cooled by, a cryostat or cooling element 308 (e.g., thermoelectric element or Peltier cooler) such that the phosphor's 304 temperature is no more than 77 K.

In one or more embodiments of the method of FIG. 1, various samples were prepared via microwave-assisted sol-gel reactions as follows.

The step(s) of Block 100 can include the following. In a typical synthesis, a 2:1 mixture (v/v) of MilliPore (18 MΩ·cm) water and ethanol adjusted to a pH of 2-3 through the addition of several drops of glacial acetic acid (EMD). Subsequently, a 5-6 times excess (in terms of metal cations) of citric acid (99.5%, Alfa Aesar) was added and the solution was stirred until clear (approx. 10 minutes at 500 rpm). Then, under constant stirring, stoichiometric amounts of $BaCO_3$ (99.95%, Alfa Aesar), $Mg(NO_3)_2$ hexahydrate (98%, Alfa Aesar) Tetraethylorthosilicate (TEOS, Sigma-Aldrich), $Tb(NO_3)_3$ pentahydrate (99.9%, Sigma-Aldrich), $Eu(NO_3)_3$ pentahydrate (99.9%, Sigma-Aldrich) and $Li_2CO_3$ (Sigma-Aldrich) were dissolved and the solution was allowed to slowly evaporate (e.g., as represented in block 102) at 65° C. until a transparent gel is formed.

This gel is then dried at 125° C. overnight (e.g., as represented by Block 104) and finely ground to form a powder (e.g., as represented by Block 106). Eventually, the ground powder is heated to 400° C. (held for 4 hours) and finally to 650° C. (held for 6 hours), e.g., as represented by Block 108. The obtained powder is reground (e.g., as represented in Block 110) and was then heat-treated (e.g., Block 112) in a microwave setup as illustrated in FIG. 2 and as recently described by our group in [26-28].

II. Phosphor Characterization Apparatus a. X-Ray Diffraction

Laboratory powder X-ray diffraction (XRD) data were obtained using Cu Kα radiation (Philips X'Pert) over the angular range 15°<2θ<90° with a step size of 0.016°. Full profile fits employing the LeBail method [31] were obtained using TOPAS Academic [32].

b. Thermogravimetric Analysis (TGA)

TGA was carried out using a METTLER TGA/sDTA851e ThermoGravimetric Analyzer under $N_2$/air scanning the temperature range between 25° C. and 1000° C. at a heating rate of 10° C. per minute.

c. Electron Microscopy

Field-emission scanning electron microscopy was performed on a FEI XL40 Sirion FEG microscope with an Oxford Inca X-ray system attached for chemical analysis. SEM samples were mounted on aluminum stubs using double-sided conductive carbon tape. The images have been recorded with an acceleration voltage of 5 kV.

d. Optical Measurements

Photoluminescence (PL) spectra were obtained on a Perkin Elmer LS55 spectrophotometer, scanning a wavelength range from 325 nm to 825 nm. The samples were thoroughly ground and subsequently mixed within a silicone resin. A small drop was administered onto a small piece of glass and cured at 150° C. for 15 minutes. Photoluminescence quantum yield (PLQY) was measured with 351 and 405 nm excitation using an argon laser and an experimental protocol as described by Greenham et al. [33] Further details of PLQY measurements as well as the procedure to determine the temperature-dependence of the photoluminescence properties are to be found elsewhere [27]. Luminescence life-time measurements were performed using Time-Correlated Single Photon Counting (TCSPC) technique [34]. Approximately 200 femtosecond (fs) excitation pulses with wavelength 440 nm were generated by doubling the fundamental frequency of a fs-Ti:Sapphire laser (Coherent Mira 900) pulses in a commercial optical harmonic generator (Inrad). The laser repetition rate was reduced to 200 KHz by a home-made acousto-optical pulse picker in order to avoid any saturation effects. The TCSPC system is equipped with an ultrafast micro-channel plate photomultiplier tube detector (Hamamatsu R3809U-51) and an electronics board (Becker & Hickl SPC-630) and has an instrument response time of about 60-65 picoseconds. The triggering signal for the TCSPC board was generated by sending a small fraction of the laser beam onto a fast (400 MHz bandwidth) Si photo-diode (Thorlabs Inc.). The fluorescence signal was dispersed in an Acton Research SPC-500 monochromator after passing through a pump blocking, long wavelength-pass, autofluorescence-free, interference filter (Omega Filters, ALP series). The monochromator is equipped with a CCD camera (Roper Scientific PIXIS-400), allowing for monitoring of the time-averaged fluorescence spectrum Luminescence transients were not deconvolved with the instrument response function since their characteristic time-constants were much longer than the width of the system response to the excitation pulse.

III. Characterization of Compositions of Matter Fabricated According to One or More Embodiments.

1. $Ba_3MgSi_2O_8$ Phase

As a first step, we have investigated the formation process of the desired $Ba_3MgSi_2O_8$ phase according to one or more embodiments, prepared by the microwave-assisted sol-gel pathway according to one or more embodiments, using thermogravimetric analyses (TGA).

The total weight loss of the sample is about 80%, which is mostly due to the thermal decomposition of the citric acid (or the citrate complexes) and volatile precursors. It can be seen that most of the mass loss occurs up to 600° C., while increasing the temperature to 1000° C. shows only very little additional loss. The TGA curve contains a total of two significant weight loss stages, located between room-temperature and below 200° C. (the corresponding sDTA curve obtained using the Thermogravimetric analyzer reveals an endothermic peak), and between 200° C. and about 650° C. (the sDTA curve shows several peaks, all of them being exothermic).

The results obtained for the decomposition here are comparable to the results that we have obtained in earlier studies on the sol-gel preparation of orthosilicates [35]. In short, the weight loss occurring below 200° C. is due to the desorption of residual water and surface agents in the dried gel. The main combustion of the chelating agent in the specimen occurs in a multi-step process, starting at around 250° C. and is mostly finished at 600° C. The sDTA curve shows two broad exothermic peaks in this temperature region. In order to completely decompose the citric acid (complexes), the phosphor samples are heated to a maximum of 650° C. before they are subjected to the microwave treatment. This reduces the amount of residual carbon impurities that is present if the dried gel (at 125° C.) is decomposed in the microwave. These carbon residues diminish the quantum yield to a minimum.

Since $Ba_3MgSi_2O_8$, co-activated with $Eu^{2+}$ and $Mn^{2+}$ has been studied extensively by many other groups before us [12,13,18,19,36], we will focus here on the co-activation with europium and terbium, as well as the full-color emitting samples.

2. $Ba_3MgSi_2O_8$, Co-Activated with $Eu^{2+}$ and $Tb^{3+}$ a. Structural Characterization of As mentioned above, the green emission observed from $Ba_3MgSi_2O_8$ samples activated with $Eu^{2+}$ in earlier reports has been shown to be due to a significant amount of orthosilicate ($Ba_2SiO_4:Eu^{2+}$) impurity [18]. $Ba_2SiO_4:Eu^{2+}$ shows a strong, broad emission band in the green region, centered around 505 nm. Although several attempts have been made to systematically tune the intensity of the green emission (due to the orthosilicate impurity), [37] the amount of $Ba_2SiO_4:Eu^{2+}$ varies from sample to sample, therefore making this route unsuitable for the preparation of full-color emitting materials.

To circumvent this issue, we have co-activated $Ba_3MgSi_2O_8$ with $Eu^{2+}$ (to achieve emission in the blue) as well as $Tb^{3+}$, which is known to yield green emission, due to the f→f transitions within the trivalent terbium ion. Since the divalent barium is replaced with a trivalent cation, it is important to maintain charge balance; therefore, the appropriate amounts of $Mg^{2+}$ are substituted with $Li^+$, due to their very similar ionic radius r (ionic radius of $Li^+$=$rLi^+$ (Coordination Number CN=6)=0.76 Å, ionic radius of $Mg^{2+}$=$rMg^{2+}$ (Coordination Number CN=6)=0.72 Å) and chemical behavior.

Figure 4:
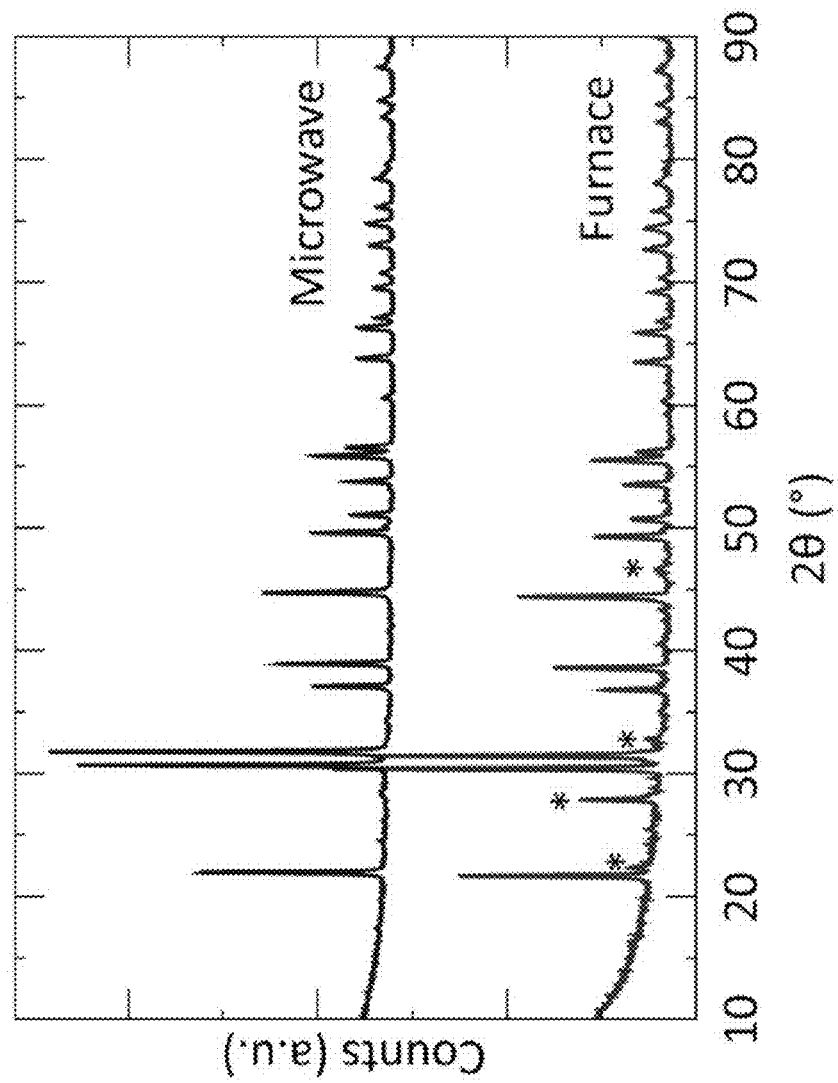
FIG. 4 illustrates X-ray diffraction data for a phosphor comprising $Ba_3MgSi_2O_8$ co-activated with $Eu^{2+}$ and $Tb^{3+}$ fabricated using microwave radiation and according to Example 3 and using furnace heating according to Example 5.

Amounts of up to 10 mol-% terbium (and lithium) can be introduced without the formation of any significant impurities. If the terbium (lithium) content approaches equals 15-mol %, the amount of impurities that are found in the samples increases and they are present more frequently. These secondary phases will affect the optical properties, as will be discussed later. All specimens investigated here (prepared via a microwave-assisted sol-gel method) exhibit very good phase purity, as demonstrated by a full-profile pattern fit (LeBail fit) of a specimen co-activated with 1% $Eu^{2+}$ and 10% $Tb^{3+}$, shown in FIG. 4.

We have also found that omission of the charge compensator ion, even at low terbium concentrations or replacing, for example, $Si^{4+}$ with $Al^{3+}$ leads to a more significant side product formation.

The fit shows that the major phase is $Ba_3MgSi_2O_8$, and only minor amounts of silicate impurities (such as $Ba_2SiO_4$) are found. This is in good agreement with earlier reports in the literature, in which usually at least one other silicate (impurity) phase is present [22]. However, it is important to note that the amount of these impurities is too small for them to influence the optical properties significantly, i.e. no emission from either secondary phase is observed, as will be demonstrated later.

We would like to emphasize that the samples prepared using the microwave-assisted pathway generally show better phase purity than reference samples that have been prepared more traditionally, i.e. in a high-temperature tube furnace (under $H_2/N_2$ reducing atmosphere), in addition to the much shorter reaction time.

For many lighting applications, the size and shape of the employed phosphor play an important role. Hence, the particle morphology of samples prepared using the microwave-assisted preparation has been investigated. No defined morphology is observed, the microwave-prepared sample rather consists of ill-defined particles of different sizes that form larger agglomerates, up to several micrometers in size.

This is due to the rather long heating time and the high temperature (1150° C. after 25 minutes of reaction time) that are obtained during the course of the reaction. Only the expected elements (except Li, due to the energy range of the detector and Eu, due to the very small amount that has been incorporated) are present, confirming that the microwave-assisted preparation is a suitable pathway to prepare high quality phosphors. The small carbon impurity seen is due to the adhesive carbon tape that is used in the preparation of the specimen.

b. Optical Characterization

We have first studied the room-temperature optical properties of the $Eu^{2+}$, $Tb^{3+}$ co-activated $Ba_3MgSi_2O_8$ by means of emission and excitation spectroscopy.

The excitation spectrum of $Ba_3MgSi_2O_8$ activated with 1% $Eu^{2+}$ exhibits several broad bands, peaking at 335 nm, 358 nm and a shoulder around 405 nm. These bands are due to the $4f^7 \rightarrow 5d^1 4f^6(^8S_{7/2})$ transitions within the $Eu^{2+}$ ions. The excitation band reaches into the near-UV part of the spectrum, revealing the possibility of exciting $Ba_{2.97}Eu_{0.03}MgSi_2O_8$ with near-UV light emitting diodes used in solid-state lighting applications. The emission spectrum under 395 nm excitation consists of a very intense and broad (Full Width at Half Maximum (FWHM) of about 35 nm) band centered around 435 nm. Both values are in good agreement with earlier reports [14,15,21].

It has been shown that it is possible to express the crystal field depression, also called the spectroscopic redshift [37] $D(Q;A)$, by the following expression:

$$D(Q,A)=E_{Afree}(n,Q)-E_{abs}(n,Q,A)$$

Here, $E_{Afree}(n,Q)$ is a constant for each lanthanide ion, [39] and $E_{abs}(n,Q,A)$ is the observed value for the lowest f d-absorption. The variables n, Q and A represent the number of electrons in the f-shell, the oxidation state (here Q=2+) and the effect of the host crystal, respectively. Using the tabulated data [40] for $Eu^{2+}$ of 34000 cm$^{-1}$ for $E_{Afree}(n;Q)$ and the value that we have determined for $E_{abs}(n;Q;A)$=24691 cm$^{-1}$ (405 nm), we can calculate $D(Q;A)$ and find a value of 9308 cm$^{-1}$ for the microwave-prepared sample, which is in excellent agreement with the tabulated value in the literature [40].

If we introduce trivalent terbium ions into the host lattice, we observe several (rather sharp) excitation peaks in the region between 300 and 500 nm. The overlap of the emission spectrum of $Ba_{2.97}Eu_{0.03}MgSi_2O_8$ and the excitation bands of $Tb^{3+}$ that are due to several f→f excitation pathways within the terbium ions. When excited with 365 nm radiation, the specimen activated with 10% of $Tb^{3+}$ exhibits green emission, again with multiple rather sharp bands ranging from 500 nm to 700 nm. These peaks have been assigned to several of the $^5D_7$-$^7F_J$ transitions of the $Tb^{3+}$ ion [41].

Due to the spectral overlap between the emission spectrum of $Eu^{2+}$ and parts of the excitation spectrum of $Tb^{3+}$, we can expect some energy transfer between these two ions, if introduced into the host lattice. Under 395 nm excitation, it shows features that result from both dopant ions; the broad blue emission band due to $Eu^{2+}$ and the sharp $^5D_7$-$^7F_J$ transitions of the $Tb^{3+}$ ion. The excitation spectra for the most intense band (543 nm for $Tb^{3+}$) show strong similarities to the excitation spectrum of the solely europium-activated $Ba_3MgSi_2O_8$, supporting the energy transfer effect between the two dopants. Here, the europium ions act as both sensitizer and activator.

The observed emission spectra exhibit the broad emission in the blue as well as the emission bands that can be attributed to $Tb^{3+}$, with the most prominent emission being centered around 543 nm. As expected, the relative intensity of the green emission increases with the addition of more terbium into the host lattice. However, due to the rather large amount of orthosilicate impurity that is usually found in samples with 15-mol % or more of $Tb^{3+}$, we find the broad, intense emission centered around 505 nm that is characteristic for $Ba_2SiO_4$:$Eu^{2+}$[14].

Using this knowledge, we have shown that it is preferable that the $Eu^{2+}$ concentration is 0.1 to 5 mol %, providing enough sensitize/activator ion for the energy transfer, it is more preferable that concentration is 1 to 3 mol %, it is most preferable that $Eu^{2+}$ concentration is close to 2% as this provides the best balance between a strong emission in the blue and the energy transfer required for the sensitization of $Tb^{3+}$ and $Mn^{2+}$. In terms of terbium concentration, it is preferable that $Tb^{3+}$ concentration is 0.1 to 15 mol %, where the terbium reaches its solubility limit. It is more preferable that $Tb^{3+}$ concentration is 2 to 12.5 mol %, as this provides a more intense green emission without the significant formation of secondary phases. It is more preferable that $Tb^{3+}$ concentration is 8 to 12 mol %, as this is the most efficient combination with the most preferable amount of europium dopants. For the $Mn^{2+}$ substitution, it is preferable that the concentration is 0.1 to 5 mol %, it is more preferable that this concentration is 1 to 4 mol % and it is most preferable that the concentration range is 2-3% as this is the most efficient combination with the most preferable amounts of $Eu^{2+}$ and $Tb^{3+}$.

We have therefore limited the amount of terbium to a maximum of 10 mol % in all further investigated samples.

Another important feature of luminescent materials is their thermal stability. Here, several observations are important, as detailed below.
 (i) There is no significant shift in the position of the emission maximum of the emission bands originating from both dopant ions ($Eu^{2+}$ and $Tb^{3+}$, wherein blue and green emission originates from the $Eu^{2+}$ and $Tb^{3+}$ dopant ions respectively). While the f→f transitions usually show only very little temperature-dependence (in regards to their position), 5d→4f transitions very often show a strong shift with an increase in temperature [28].
 (ii) The emission intensity is strongly temperature-dependent. At room-temperature, the intensity has dropped to about 50% of the value observed at 77K; and
 (iii) The bands originating from the two dopant ions show a different thermal robustness, meaning that the intensity of the green emission ($Tb^{3+}$) decays faster than the blue europium emission, resulting in different quenching temperatures determined from the emission spectra, namely Temperature $T_{1/2}$ at which emission intensity is halved $T_{1/2}$(total)=313K, $T_{1/2}$ ($Eu^{2+}$)=323K and $T_{1/2}$ ($Tb^{3+}$)=285K. This leads to a change in color temperature and CIE coordinates of a typical $Ba_3MgSi_2O_8$ sample co activated with 1% $Eu^{2+}$ and 10% $Tb^{3+}$, as shown in Table 1, which shows the maximum emission intensity is measured (at least) at liquid nitrogen (77K) or below.

TABLE 1

| T (K) | integrated Intensity | CIE x | CIE y | Ra |
|---|---|---|---|---|
| 77 | 1 | 0.20 | 0.16 | 66 |
| 295 | 0.59 | 0.19 | 0.14 | 59 |
| 473 | 0.06 | 0.19 | 0.15 | 62 |

Since emission intensities are often not entirely satisfactory to determine thermal quenching behavior [42], we have elucidated the temperature-dependence of the photoluminescence lifetime of the $Eu^{2+}$ emission. We would like to note here that although there are three potential lattice sites available, we have only studied the decay behavior at the maximum of the blue emission band at 440 nm. A more detailed investigation of the cation distribution and its influence on the luminescent properties is currently being conducted.

As a first step, we have determined the transfer efficiency between the europium and the terbium ions at 77K in order to assure that there are as few other non-radiative pathways present as possible. The average decay time $\tau_{avg}$, especially of traces that deviate from a mono-exponential decay, can be calculated according to [43]:

$$\tau_{avg.} = \frac{\int_0^\infty t I(t)\,dt}{\int_0^\infty I(t)\,dt}$$

where I(t) is the integrated emission intensity as function of time t. The average decay time, different samples (only $Eu^{2+}$ and $Eu^{2+}$, $Tb^{3+}$), of the $5d^1 4f^6(^8S_{7/2})\rightarrow 4f^7$ transition within the $Eu^{2+}$ ions without any terbium addition is found to be about 285 ns (290 ns from the single-exponential fit and 281 ns from the calculation according to Eq. (2)). This is comparable to values that have been found for similar host lattices [44].

The experimentally determined lifetime can be expressed as:

$$\frac{1}{\tau} = \frac{1}{\tau_0} + A_{nr} + P_t$$

Here, $\tau_0$ is the radiative lifetime of the monitored emission, $A_{nr}$ is the decay rate due to non-radiative pathways, such as (multi)phonon relaxations, and $P_t$ is the energy transfer rate.

If there exists a non-radiative energy transfer pathway between the $Eu^{2+}$ ions, which would then act as both, the activator as well as the sensitizer for $Tb^{3+}$, the fluorescence lifetimes (monitored at 77K) of the emission at 440 nm should decrease. This is what we find; in Eu, Tb co-activated samples, the decay time decreases to an average value of about 240 nanoseconds (ns), due to the energy transfer between the $Eu^{2+}$ and $Tb^{3+}$ ions. In addition, the decay curve of the emission monitored at 440 nm deviates slightly from a mono-exponential decay. A bi-exponential fit yields two different decay constants, $\tau_1$=42 ns and $\tau_2$=238 ns, pointing towards the fact that there are at least two different pathways for the energy transfer between the dopant ions present. A possible reason for this behavior is that the energy transfer efficiency between $Eu^{2+}$ ions occupying different crystallographic sites and the $Tb^{3+}$ ions varies with the site.

Now, the efficiency of the energy transfer can be expressed by [45]:

$$\eta_T = 1 - \frac{\tau_s}{\tau_{s0}}$$

Here, $\tau_{s0}$ and $\tau_s$ are the decay times of the donor in absence ($\tau_{s0}$) and in presence ($\tau_s$) of the acceptor, respectively. In this case donor refers to $Eu^{2+}$ as it transfers its energy to $Tb^{3+}$ (and in the case of the full-color material also $Mn^{2+}$), therefore Tb and Mn are the acceptors.

If we employ the calculated, average lifetime values, we find a transfer efficiency of about 20% between $Eu^{2+}$ and $Tb^{3+}$ (with 10% terbium (lithium) incorporated into the sample).

For an allowed transition, such as the $5d^1 4f^6(^8S_{7/2}) \rightarrow 4f^7$ transition within the $Eu^{2+}$ ions, the decay time should be independent of the temperature, at least until at elevated temperatures more non-radiative pathways become accessible. The decay behavior of the solely europium-activated sample shows almost no deviation from a mono-exponential decay until 353K, proving that the $5d^1 4f^6(^8S_{7/2}) \rightarrow 4f^7$ transition is very temperature stable, although the values that we find are lower than the quenching temperatures that Blasse et al. have found [14].

The temperature-stability changes notably with the introduction of the terbium ions into $Ba_3MgSi_2O_8$. The decay curve deviates from a mono-exponential decay, even at 77K and the (average) lifetime decreases notably with an increase in temperature. We explain this with more non-radiative pathways that become available due to the introduction of the dopant ions (Tb, Li), leading to a quicker depopulation of the excited states. This is in strong accordance with the measured trend in emission intensity.

3. $Ba_3MgSi_2O_8$, Co-Activated with $Eu^{2+}$, $Tb^{3+}$ and $Mn^{2+}$
a. Structural Characterization.

In order to achieve a full-color phosphor, i.e. a material with emission bands covering the complete visible range of the electromagnetic spectrum, $Ba_3MgSi_2O_8$ co-activated with europium (acting as both sensitizer and activator), terbium and manganese have been investigated. After further optimization of the preparation route, samples with almost 100% phase purity could be obtained. Only trace amounts of barium orthosilicate ($Ba_2SiO_4$) can be detected. The addition of small amounts of manganese does not change the observed morphology and again, only the expected elements are present.

Figure 5:
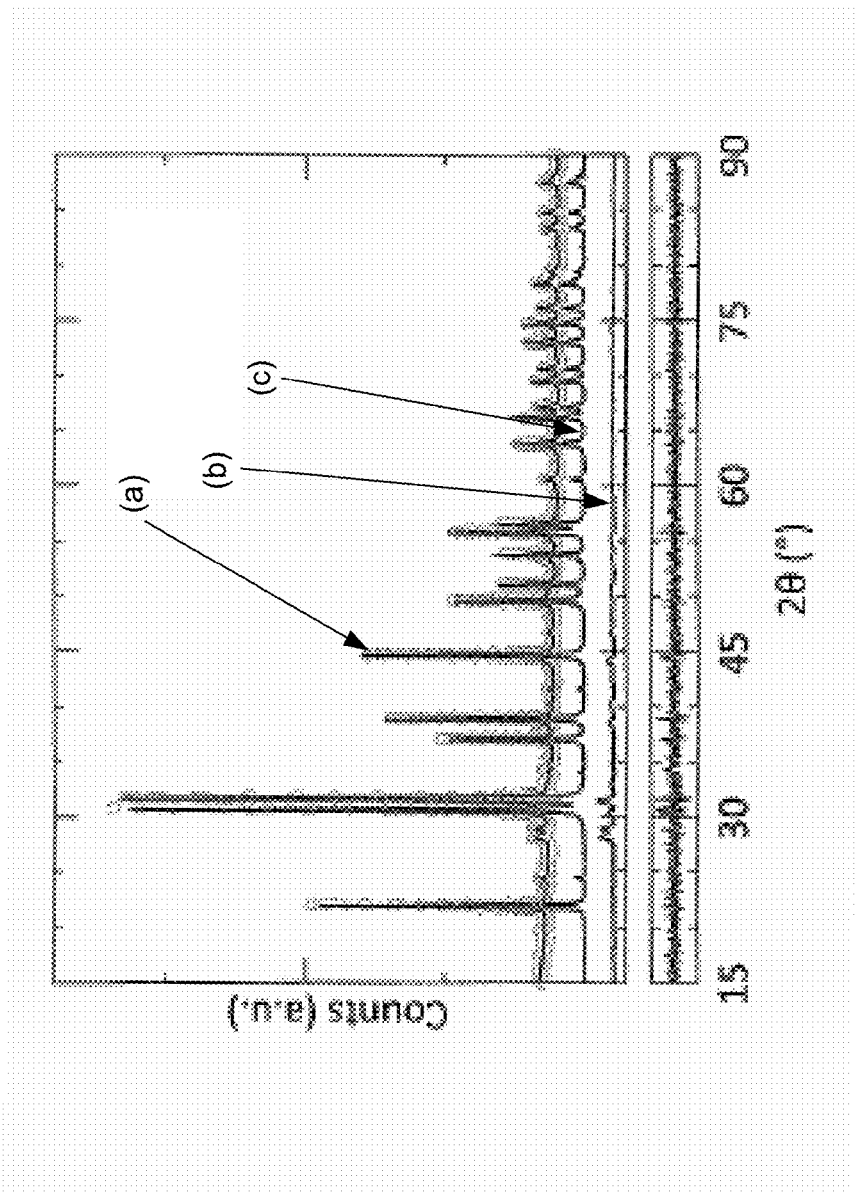
FIG. 5 illustrates (a) the X-ray diffraction pattern for $Ba_3MgSi_2O_8$ co-activated with 2% $Eu^{2+}$, 10% $Tb^{3+}$ and 2% $Mn^{2+}$ fabricated using microwaves and according to Example 4,(b)the X-ray diffraction pattern for $Ba_2SiO_4$, showing trace/small amounts of $Ba_2SiO_4$ are present in the phosphor compound measured in (a), and (c) the LeBail fitting of (a).

FIG. 5 illustrates X-ray diffraction patterns, including the LeBail fitting, for $Ba_3MgSi_2O_8$ co-activated with 2% $Eu^{2+}$, 10% $Tb^{3+}$ and 2% $Mn^{2+}$, fabricated using microwaves.

b. Color Tuning.

Figure 6A:
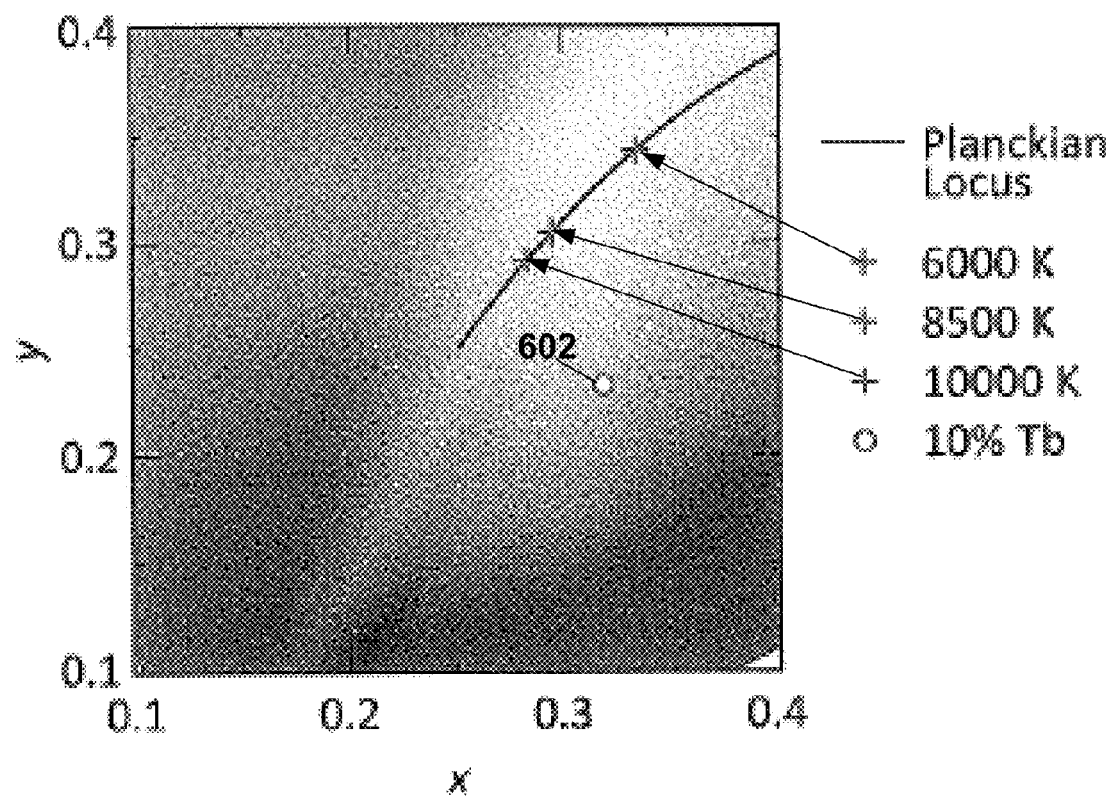
FIGS. 6(a) and 6(b) are Commission Internationale de L'Eclairage (CIE) diagrams for the phosphor with a Tb content of 10% and fabricated according to Example 4.
Figure 6B:
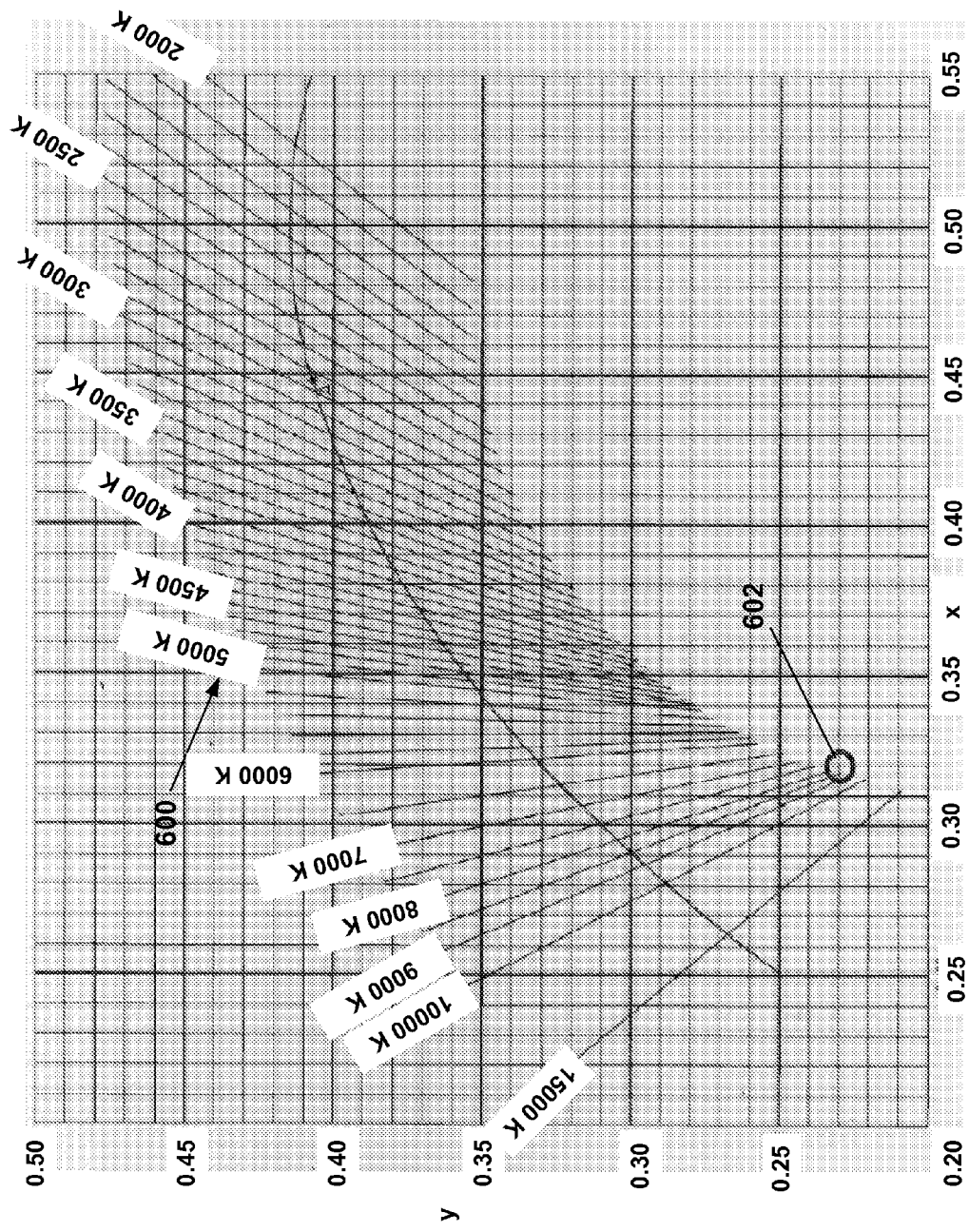

FIGS. 6(*a*)-6(*b*) show CIE 1931 diagrams with color coordinates x,y, and color temperature (color temperature scale 600 in Kelvin (K)) for $Ba_3MgSi_2O_8$ co-activated with 2% $Eu^{2+}$, 10% $Tb^{3+}$ and 2% $Mn^{2+}$, wherein the color coordinate for the phosphor is indicated by the circle 602. In the example measured in FIG. 6(*b*), the color temperature of the $Ba_3MgSi_2O_8$ phosphor co-activated with 2% $Eu^{2+}$, 10% $Tb^{3+}$ and 2% $Mn^{2+}$ is around 9000 Kelvin.

In order to not only obtain tri-band emission, but to achieve actual "'white'" light emission, different amounts of $Eu^{2+}$, $Tb^{3+}$ and $Mn^{2+}$ have been incorporated into the host structure.

We have found that a concentration of about 2-mol % for $Eu^{2+}$ and about 1.5-2-mol % for $Mn^{2+}$ yielded the most efficient samples. Various amounts of $Tb^{3+}$ have then been added to obtain the desired emission band in the green part of the visible spectrum. It is evident that the more $Tb^{3+}$ is added to the host, the stronger the green, but also the red emission become in terms of relative intensity values. Adding amounts greater than 10% of $Tb^{3+}$ seems to have little effect on the emission intensity of the green emission band at around 542 nm. Only the red emission increases slightly.

Due to the fact that the outer lying d-orbitals of $Eu^{2+}$ are very sensitive to changes in the bond length (and associated with that changes in the crystal field splitting), we can see a clear shift towards longer wavelengths (i.e. smaller energies, meaning a larger crystal field splitting) with the addition of Tb3+ to the europium-activated host. The crystal field splitting (Dq or $\Delta$) can be expressed by the following equation:[46]

$$Dq = \frac{1}{6} Ze^2 \frac{r^4}{R^5}$$

Here, Z is the valence of the coordinating anion, e is the elemental charge, r is the radius of the d-wavefunction and R is the bond length between the activator ion and the coordinating anion. As we observe a red shift (from about 435 nm in the case of no $Tb^{3+}$ to 444 nm with 10% $Tb^{3+}$) in the emission maximum of the europium emission, the formula implies that through the introduction of the smaller $Tb^{3+}$ (radius of $Tb^{3+}=rTb^{3+}$ (CN=9)=1.095 Å, radius of $Ba=rBa^{2+}$ (CN=9) 1.47 Å) onto the $Ba^{2+}$ site(s), the bond length (R of Eu—O) between the surrounding oxygen ligands and the $Eu^{2+}$ ions decreases. Interestingly, the d→d of the $Mn^{2+}$ ion seems to be unaffected by this, as we find no significant shift in the emission wavelength here. A more detailed study of the bond lengths making use of neutron diffraction is currently being conducted.

An increase in the terbium concentration moves the color coordinate closer to the desired white point (0.33, 0.33). By overcoming the problem of the solubility limit of $Tb^{3+}$ and $Li^+$ in the host structure, the color temperature and CIE coordinates of the white light emission can be improved.

As described before, optimization of the dopant concentration has shown that the most efficient full-color emission (and the "white" light with lowest color temperature and color co-ordinates closest to the Plankian locus) originates from samples activated with 2% $Eu^{2+}$, 10% $Tb^{3+}$ and 2% $Mn^{2+}$, the phase purity of which has been confirmed; therefore, all further optical studies have been carried out on these specimens.

c. Optical Characterization.

Figure 7:
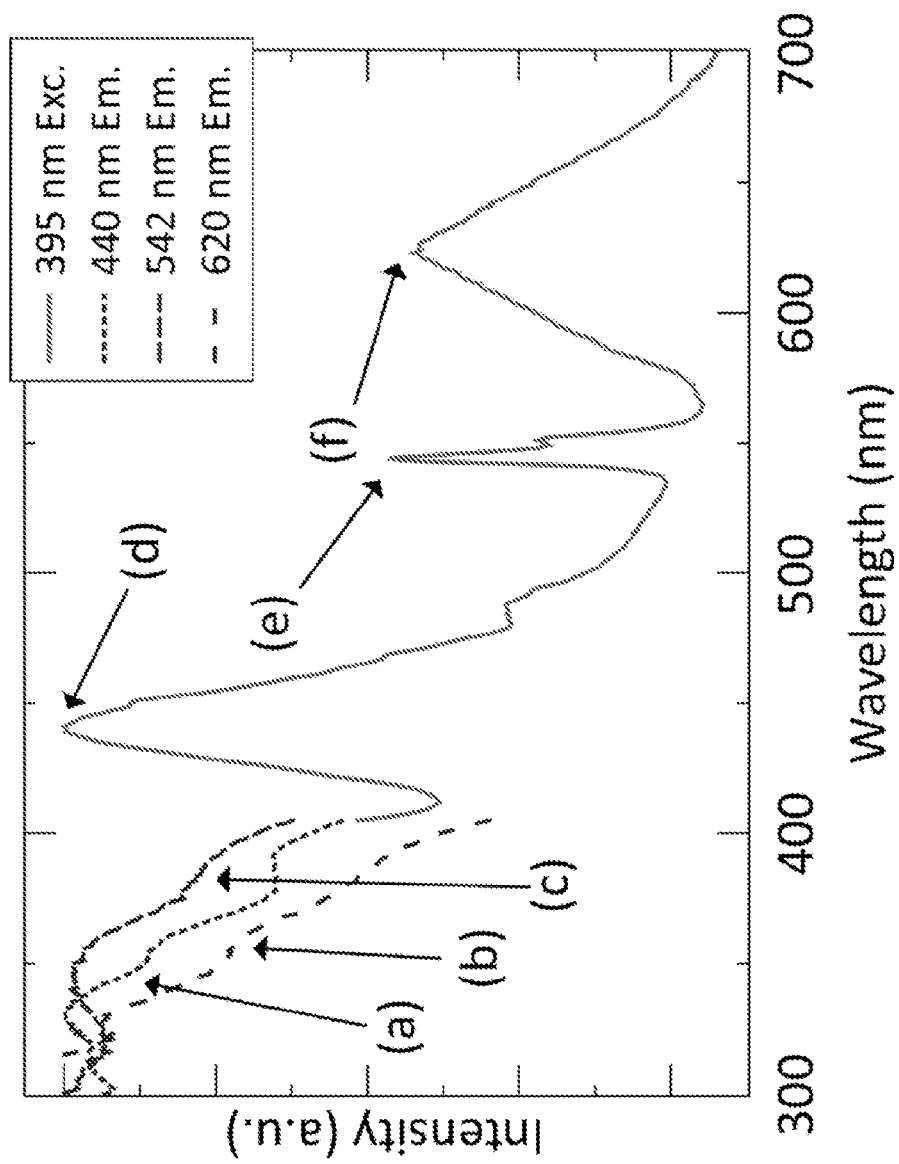
FIG. 7 demonstrates the signature, full spectrum photoluminescent profile of $Ba_3MgSi_2O_8$ co-activated with 2 mol % europium, 10 mol % terbium and 2 mol % manganese, according to one or more embodiments where; (a) is the excitation spectrum that excites emission at 440 nm from the Eu$^{2+}$ ions, (b) is the excitation spectrum that excites emission at 620 nm from the Mn$^{2+}$ ions, (c) is the excitation spectrum that excites emission at 542 nm from the Tb3+ ions, (d) is the photoluminescent contribution from Eu$^{2+}$ ions at with 395 nm excitation, (e) is the photoluminescent contribution from Tb$^{3+}$ ions at 395 nm excitation, and (f) is the photoluminescent contribution from Mn$^{2+}$ at 395 nm excitation, wherein the Ba$_3$MgSi$_2$O$_8$ is fabricated according to Example 4.

FIG. 7 demonstrates the signature, full spectrum photoluminescent profile of $Ba_3MgSi_2O_8$ co-activated with 2 mol % europium, 10 mol % terbium and 2 mol % manganese, according to one or more embodiments where; (a) is the excitation profile at 440 nm, (b) is the excitation profile at 620 nm, (c) is the excitation profile at 542 nm, (d) is the photoluminescent contribution from $Eu^{2+}$ ions at with 395 nm excitation, (e) is the photoluminescent contribution from $Tb^{3+}$ ions at 395 nm excitation, and (f) is the photoluminescent contribution from $Mn^{2+}$ at 395 nm excitation.

The room-temperature emission and excitation spectra of samples with the composition $Ba_{2.64}Eu_{0.06}Tb_{0.3}Mg_{0.68}Mn_{0.02}Li_{0.3}Si_2O_8$ shows a broad and intense emission band in the blue (centered around 440 nm), originating from the 5d→4f transition within the europium ion. The green emission band (with its maximum at around 542 nm) and the broad, red emission at 620 nm due to the d→d transitions of the $Mn^{2+}$ ion complete the true full color emission.

Again, a comparison of the excitation spectra recorded at the respective maximum of the three emission band reveals that there is energy-transfer present, due to the fact that all three excitation spectra exhibit the same fine structure, resembling the sample with only $Eu^{2+}$.

The thermal robustness of the full-color emitting samples has also been investigated. Emission spectra under 395 nm excitation in the temperature range between 77K and 473K, normalized to the absolute maximum of the emission intensity at 77K have been recorded. The degradation in intensity is equally pronounced as it is in the case of europium, terbium co-activation. At room-temperature, the (total) integrated emission intensity has dropped to about 50% of the value at 77K, leading to $T_{1/2}$ values of 265K for the blue, 275K for the green, 355K for the red and 300K for the total emission of the sample, being much lower than in earlier reports [14,47].

While we observe no shift in the position of the maximum of the three emission bands, there is a very significant shift in color coordinates and color rendering index with a change in temperature, which might be due to the fact that at elevated temperatures the very small (trace) amounts of orthosilicate, that do not exhibit any measurable emission at 77K and room-temperature, become more prominent. To circumvent this issue, we are currently further optimizing our preparation method, in order to completely eliminate these impurities and to enhance the emission properties above room-temperature, e.g. through the use of fluxes.

Dorenbos [47] has shown that in alkaline-earth compounds, the thermal quenching of the $Eu^{2+}$ luminescence is mostly due to the promotion of an electron from the divalent europium to the conduction band of the host lattice. Using the (crude) relation provided in Dorenbos [47], we can estimate the activation energy of the thermal quenching process, according to:

TABLE 2

$$\Delta E = \frac{T_{1/2}}{680} eV$$

| T (K) | norm. Int. | $(Eu^{2+})$ | $(Tb^{3+})$ | $(Mn^{2+})$ | CIE x | CIE y | Ra |
|---|---|---|---|---|---|---|---|
| 77 | 1 | 1 | 1 | 1 | 0.24 | 0.22 | 83 |
| 295 | 0.51 | 0.41 | 0.40 | 0.63 | 0.29 | 0.26 | 65 |
| 473 | 0.13 | 0.07 | 0.09 | 0.20 | 0.35 | 0.33 | 84 | where $T_{1/2}$ is the obtained quenching temperature for the respective transition and $\Delta E$ is the activation energy for the thermal quenching. Using the values found from the temperature-dependent studies, we find an activation energy of 0.390 eV for the blue, 0.404 eV for the green, 0.522 eV for the red and 0.442 eV for the combined full-color emission.

A comparison of the temperature-dependent lifetime curves of samples with different dopant ions reveals that the decrease in efficiency is mostly due to the strong diminishing of the $Eu^{2+}$ lifetime in combination with terbium. Although rather high transfer efficiency was determined at low temperatures, the addition of terbium (and lithium) ions to the host leads to very significant decrease in the average lifetime of the europium emission, due to more efficient non-radiative relaxation pathways. The calculated average lifetimes as a function of temperature; it becomes evident that the strong decrease is mostly due to Eu—Tb pair interactions.

While it is possible to characterize the purity of the phosphor at low temperature 77K, embodiments of the present invention do not exclude use at other temperatures. For example, embodiments of the present invention can be used (e.g., for commercial use) at room temperature 300K.

Finally, we have determined the quantum yield of the various prepared samples. At room-temperature, a quantum yield of about 10% has been determined. The addition of certain flux materials (such as $NH_4F$) has increased that value to 15%, however, more impurities are present. A skilled individual in the art can recognize the scope is not limited to this flux. Other fluxes include, but are not limited to; $H_3BO_3$, alkaline or ammonium halides, alkaline earth halides, rare earth halides or a combination thereof.

Thus, a variety of flux materials (added during heating in Block 110 of FIG. 1) can be tested for their effectiveness to improve the formation of e.g., $Ba_3MgSiO_2$, and the post annealing in strongly reducing atmospheres (during heating in Block 112 of FIG. 1) can be optimized to enhance the reduction of Europium and Manganese to the desired divalent states. The flux material should be ground with powder prior to final heating.

IV. Synthesis of Further Examples According to One or More Embodiments of the Method Illustrated in FIG. 1

1. Example 1. Typical Synthesis of Un-Doped Host Material.

The various samples were prepared via microwave-assisted sol-gel reactions. In a typical synthesis of the un-doped host material, a total volume of 30 mL of a 2:1 mixture (v/v) of MilliPore (18 MΩ·cm) water and ethanol was adjusted to a pH of 2-3 through the addition of several drops of glacial acetic acid (EMD). Subsequently, a 5-6 times excess (in terms of metal cations) of citric acid (99.5%, Alfa Aesar) was added and the solution was stirred until clear (approx. 10 minutes at 500 rpm). Then, under constant stirring, 3 mol of $BaCO_3$ (99.95%, Alfa Aesar), 1 mol of $Mg(NO_3)_2$ hexahydrate (98%, Alfa Aesar) and 2 mols of Tetraethylorthosilicate (TEOS, Sigma-Aldrich), were dissolved and the solution was allowed to slowly evaporate at 65° C. until a transparent gel is formed, which usually took 6-10 hours.

In the same container, this gel is then dried at 125° C. for about 12-14 hours and eventually finely ground into a brown powder. This powder is heated to 400° C. (heating ramp of 2 hours, dwell time at 400° C. is 2 hours) and finally to 650° C. (dwell time of 6 hours). The obtained powder is reground and was then heat-treated in a microwave setup, as recently described by our group [26-28]. Typically, a total reaction time of 25 minutes, consisting of a first heating step of about 10 minutes at a power level of 50% followed by a second heating step of about 15 minutes at a power lever setting of 40%. After the reaction vessel has cooled down to room-temperature, the resulting powder was ground again, yielding the final product.

2. Example 2. Typical Synthesis of the $Eu^{2+}$-Doped Material.

A total volume of 30 mL of a 2:1 mixture (v/v) of MilliPore (18 MΩ·cm) water and ethanol was adjusted to a pH of 2-3 through the addition of several drops of glacial acetic acid (EMD). Subsequently, a 5-6 times excess (in terms of metal cations) of citric acid (99.5%, Alfa Aesar) was added and the solution was stirred until clear (approx. 10 minutes at 500 rpm). Then, under constant stirring, 2.97 mols of $BaCO_3$ (99.95%, Alfa Aesar), 1 mol of $Mg(NO_3)_2$ hexahydrate (98%, Alfa Aesar), 2 mols of Tetraethylorthosilicate (TEOS, Sigma-Aldrich) and 0.03 mols of $Eu(NO_3)_3$ pentahydrate (99.9%, Sigma-Aldrich) were dissolved and the solution was allowed to slowly evaporate at 65° C. until a transparent gel is formed, which usually took 6-10 hours.

In the same container, this gel is then dried at 125° C. for about 12-14 hours and eventually finely ground into a brown powder. This powder is heated to 400° C. (heating ramp of 2 hours, dwell time at 400° C. is 2 hours) and finally to 650° C. (dwell time of 6 hours). The obtained powder is reground and was then heat-treated in a microwave setup, as recently described by our group [26-28]. Typically, a total reaction time of 25 minutes, consisting of a first heating step of about 10 minutes at a power level of 50% followed by a second heating step of about 15 minutes at a power lever setting of 40%. After the reaction vessel has cooled down to room-temperature, the resulting powder was ground again, yielding the final product.

3. Example 3. Typical Synthesis of the $Eu^{2+}$, $Tb^{3+}$-Co-Activated Material.

A total volume of 30 mL of a 2:1 mixture (v/v) of MilliPore (18 MΩ·cm) water and ethanol was adjusted to a pH of 2-3 through the addition of several drops of glacial acetic acid (EMD). Subsequently, a 5-6 times excess (in terms of metal cations) of citric acid (99.5%, Alfa Aesar) was added and the solution was stirred until clear (approx. 10 minutes at 500 rpm). Then, under constant stirring, 2.64 mols of $BaCO_3$ (99.95%, Alfa Aesar), 0.7 mols of $Mg(NO_3)_2$ hexahydrate (98%, Alfa Aesar), 2 mols of Tetraethylorthosilicate (TEOS, Sigma-Aldrich), 0.3 mols of $Tb(NO_3)_3$ pentahydrate (99.9%, Sigma-Aldrich), 0.06 mols of $Eu(NO_3)_3$ pentahydrate (99.9%, Sigma-Aldrich) and 0.15 mols of $Li_2CO_3$ (Sigma-Aldrich) were dissolved and the solution was allowed to slowly evaporate at 65° C. until a transparent gel is formed, which usually took 6-10 hours.

In the same container, this gel is then dried at 125° C. for about 12-14 hours and eventually finely ground into a brown powder. This powder is heated to 400° C. (heating ramp of 2 hours, dwell time at 400° C. is 2 hours) and finally to 650° C. (dwell time of 6 hours). The obtained powder is reground and was then heat-treated in a microwave setup, as recently described by our group [26-28]. Typically, a total reaction time of 25 minutes, consisting of a first heating step of about 10 minutes at a power level of 50% followed by a second heating step of about 15 minutes at a power lever setting of 40%. After the reaction vessel has cooled down to room-temperature, the resulting powder was ground again, yielding the final product.

4. Example 4. Typical Synthesis of the $Eu^{2+}$, $Tb^{3+}$, $Mn^{2+}$ Co-Activated Material.

A total volume of 30 mL of a 2:1 mixture (v/v) of MilliPore (18 MΩ·cm) water and ethanol was adjusted to a pH of 2-3 through the addition of several drops of glacial acetic acid (EMD). Subsequently, a 5-6 times excess (in terms of metal cations) of citric acid (99.5%, Alfa Aesar) was added and the solution was stirred until clear (approx. 10 minutes at 500 rpm). Then, under constant stirring, 2.64 mols of $BaCO_3$ (99.95%, Alfa Aesar), 0.68 mols of $Mg(NO_3)_2$ hexahydrate (98%, Alfa Aesar), 2 mols of Tetraethylorthosilicate (TEOS, Sigma-Aldrich), 0.3 mols of $Tb(NO_3)_3$ pentahydrate (99.9%, Sigma-Aldrich), 0.06 mols of $Eu(NO_3)_3$ pentahydrate (99.9%, Sigma-Aldrich), 0.02 mols of $MnCO_3$ (99.99%, Sigma-Aldrich) and 0.15 mols of $Li_2CO_3$ (Sigma-Aldrich) were dissolved and the solution was allowed to slowly evaporate at 65° C. until a transparent gel is formed, which usually took 6-10 hours.

In the same container, this gel is then dried at 125° C. for about 12-14 hours and eventually finely ground into a brown powder. This powder is heated to 400° C. (heating ramp of 2 hours, dwell time at 400° C. is 2 hours) and finally to 650° C. (dwell time of 6 hours). The obtained powder is reground and was then heat-treated in a microwave setup, as recently described by our group [26-28]. Typically, a total reaction time of 25 minutes, consisting of a first heating step of about 10 minutes at a power level of 50% followed by a second heating step of about 15 minutes at a power lever setting of 40%. After the reaction vessel has cooled down to room-temperature, the resulting powder was ground again, yielding the final product.

5. Example 5. Typical Furnace Synthesis of the $Eu^{2+}$, $Tb^{3+}$-Co-Activated Material.

2.79 mols of $BaCO_3$ (99.95%, Alfa Aesar), 0.95 mol of MgO (99.95%, Cerac), 0.15 mols of $Al_2O_3$ (99.99% Materion), 1.85 mols of $SiO_2$ (99.995%, Alfa Aesar), 0.06 mols of $Eu_2O_3$ (99.9%, Sigma-Aldrich), 0.05 mols of $MnCO_3$ (99.99%, Sigma-Aldrich) and 0.15 mols of $Tb_4O_7$ (99.9%, Sigma-Aldrich) were mixed and finely ground employing an alumina mortar and pestle. The powder was then transferred into and alumina crucible and heated at 1200° C. for 10 hours, with 6 hours heating and cooling ramp each.

Advantages and Improvements

One or more embodiments disclose, to the best of our knowledge, the first true full-color phosphor based upon $Ba_3MgSi_2O_8$ co-activated with $Eu^{2+}$, $Mn^{2+}$ and $Tb^{3+}$, prepared by a rapid microwave-assisted sol-gel pathway. The phase purity and structural parameters have been carefully investigated and the relations between the optical and structural properties are elucidated by means of X-ray diffraction experiments as well as extensive optical studies, including the thermal robustness of the obtained materials and their quantum yields.

In one embodiment, a microwave-assisted sol-gel pathway has been designed to prepare the widely studied silicate-based phosphor, $Ba_3MgSi_2O_8$, co-activated with europium, terbium and manganese. Through the combination of the sol-gel chemistry and microwave heating, highly phase pure samples were produced. The purity was somewhat surprising to the inventors when comparing microwave heating to traditional furnace heating.

Thus, the microwave assisted preparation route is valuable because the materials obtained using this preparative technique are purer than those prepared more conventionally (e.g., using high temperature ceramic routes). This is likely due to the accelerated reaction time that limits the formation of thermodynamically more stable side products. For example, the X-ray diffraction pattern of FIG. 5 shows that $Ba_3MgSiO_2$ is the major phase and that only minor or negligible amounts of $Ba_2SiO_4$ are formed (the latter compound cannot usually be inhibited during conventional preparations). This is of great importance as larger quantities of $Ba_2SiO_4$ that would host the added $Eu^{2+}$) exhibit a strong emission band in the green which seems desirable, however due to the inability to control the amount that is formed, temperature stability is not ensured.

In another embodiment, it is demonstrated that $Ba_3MgSi_2O_8$ exhibits full-color emission that is not due to impurity phases such as $Ba_2SiO_4$ but rather through co-activation of dopant ions. Although the optical characterization has shown that the quantum yield and temperature-stability of the samples is not optimum, it establishes a platform from which thoughtful design can be achieved through mechanistic understanding. The inventors of the present invention believe this approach is a very good starting point and that further optimization of the preparation process, e.g. through the use of fluxes, will eventually lead to more efficient materials.

In a further embodiment, an inorganic luminescent material is produced with the sum formula $Ba_3MgSi_2O_8$, co-doped with varying amounts of europium, terbium, lithium and manganese ions. After excitation with (near)-UV light in the wavelength range between 350 and 405 nm, the materials exhibits three strong emission bands in the visible region (blue ~440 nm, green ~545 nm and red ~620 nm).

Through variations in or selections of the nominal composition, i.e. the concentrations of the various dopant ions, white light emission from a single material can be obtained. This is of great interest as it circumvents the need to blend different phosphors in order to achieve white light emission when using (near)-UV LEDs as the excitation source. If doped with suitable amounts of activator ions, the material according to one or more embodiments of the invention very efficiently emits over the complete visible range when excited with near UV light e.g., wavelengths between 365 and 400 nm.

Advantages of single phase materials over blending materials together is the potentially better stability (both chemically and in terms of color) as well as the absence or reduction of reabsorption of parts of the emitted light from the green and red components that occurs in the phosphor blend, potentially leading to better luminous efficiency and color rendering index Ra.

In another embodiment, optimization of the dopant concentration has shown that the most efficient full-color emission (highest color temperature or closest to "white") originates from samples activated with 2% $Eu^{2+}$, 10% $Tb^{3+}$ and 2% $Mn^{2+}$. Through optimization of the elemental composition or amount of dopant ions, the color coordinates of one or more embodiments of the present invention can be further tuned in order to obtain warmer white light emission. Absorption properties can be enhanced using partial substitution of the barium ions with other divalent alkaline earth ions.

In yet a further embodiment, a sol-gel technique is use to prepare the precursors. This technique serves at least two purposes: 1) homogeneous mixing of constituent ions, and 2) densification of the gel at elevated temperature removes the majority of carbon impurities that have a negative effect on the quantum efficiency of the as-prepared phosphor. The gel is then dried at 125° C. overnight and finely ground, followed by a heating profile up to 650° C.

In yet a further embodiment, the sol-gel derived, densified precursor (described vida supra) is loaded into a microwave oven and irradiated for a fixed amount of time.

In one embodiment, the green emission band observed in previous $Ba_3MgSi_2O_8$ phosphors activated with $Eu^{2+}$ (due to orthosilicate $Ba_2SiO_4$:$Eu^{2+}$ impurity) is now systemically induced by co-activating $Ba_3MgSi_2O_8$ with $Eu^{2+}$ (to achieve emission in the blue) as well as $Tb^{3+}$, which is known to yield green emission, due to the f→f transitions within the trivalent terbium ion. Since, in one or more embodiments, the divalent barium is replaced with a trivalent cation ($Tb^{3+}$), it is important to maintain charge balance; therefore, the appropriate amounts of $Mg^{2+}$ are substituted with $Li^+$, due to their very similar ionic radius r (r$Li^+$ (CN=6) 0.76 Å, r$Mg^{2+}$ (CN=6) 0.72 Å) and chemical behavior.

One or more embodiments of the invention comprising $Ba_3MgSi_2O_8$ co-activated with europium, terbium and manganese, has great potential to fill this gap. If doped with suitable amounts of activator ions, the material very efficiently emits over the complete visible range, with bands at 440 nm (blue), 542 nm (green) and 620 nm (red), if excited with (near)-UV light between 365 and 400 nm, for example.

REFERENCES

The following references are incorporated by reference herein.

[1] Schubert, E. F.; Kim, J. K. Science 2005, 308, 1274-1278.

[2] Chambers, M.; Clarke, D. Annu. Rev. Mater. Sci. 2009, 39, 325-359.

[3] Pimputkar, S.; Speck, J. S.; Denbaars, S. P.; Nakamura, S, Nat. Photonics 2009, 3, 2-4.

[4] Ye, S.; Xiao, F.; Pan, Y.; Ma, Y.; Zhang, Q. Mater. Sci. Eng., R 2010, 71, 1-34.

[5] Smet, P. F.; Parmentier, A. B.; Poelman, D. J. Electrochem. Soc. 2011, 158, R37-R54.

[6] George, N. C.; Denault, K. A.; Seshadri, R. Annu. Rev. Mater. Res. 2013, 43, 2.1-2.21.

[7] Im, W. B.; Kim, Y.-I.; Fellows, N. N.; Masui, H.; Hirata, G. A.; DenBaars, S. P.; Seshadri, R. Appl. Phys. Lett 2008, 93, 091905. 369

[8] Im, W. B.; Fourré, Y.; Brinkley, S.; Sonoda, J.; Nakamura, S.; DenBaars, S. P.; Seshadri, R. Opt. Express 2009, 17, 22673.

[9] Im, W. B.; Page, K.; DenBaars, S. P.; Seshadri, R. J. Mater. Chem. 2009, 19, 8761.

[10] Im, W. B.; Fellows, N. N.; DenBaars, S. P.; Seshadri, R. J. Mater. Chem. 2009, 19, 1325.

[11] Lue, W.; Hao, Z.; Zhang, X.; Luo, Y.; Wang, X.; Zhang, J. Inorg. Chem. 2011, 50, 7846-7851.

[12] Kim, J. S.; Jeon, P. E.; Choi, J. C.; Park, H. L.; Mho, S. I.; Kim, G. C. Appl. Phys. Let. 2004, 84, 2931.

[13] Kim, J.; Park, Y.; Kim, S.; Choi, J.; Park, H. Solid State Commun. 2005, 133, 445-448.

[14] Blasse, G.; Wanmaker, W.; Tervrugt, J.; Bril, A. Philips Res. Rep. 1968, 23, 189-200.

[15] Barry, T. L. J. Electrochem. Soc. 1968, 115, 733-738.

[16] Kim, J.; Lim, K.; Jeong, Y.; Jeon, P.; Choi, J.; Park, H. Solid State Commun 2005, 135, 21-24.

[17] Kim, J. S.; Kwon, A. K.; Park, Y. H.; Choi, J. C.; Park, H. L.; Kim, G. C. J. Lumin. 2007, 122-123, 583-586.

[18] Ma, L.; Wang, D.-J.; Zhang, H.-M.; Gu, T.-C.; Yuan, Z.-H. Electrochem. Solid-State Lett. 2008, 11, E1.

[19] Aitasalo, T.; Hietikko, A.; Hölsä, J.; Lastusaari, M.; Niittykoski, J.; Piispanen, T. Z. Kristal-387 logr. Suppl. 2007, 26, 461-466.

[20] Klasens, H. A.; Hoekstra, A. H.; Cox, A. P. M. J. Electrochem. Soc. 1957, 104, 93-100.

[21] Yonesaki, Y.; Takei, T.; Kumada, N.; Kinomura, N. J. Solid State Chem. 2009, 182, 547-554.

[22] Park, C.-H.; Hong, S.-T.; Keszler, D. J. Solid State Chem. 2009, 182, 496-501.

[23] Roy, R.; Komarneni, S.; Yang, L. J. Am. Ceram. Soc. 1985, 68, 392-395.

[24] Baghurst, D.; Chippindale, A.; Mingos, D. M. P. Nature 1988, 332, 311.

[25] Biswas, K.; Muir, S.; Subramanian, M. Mater. Res. Bull. 2011, 46, 2288-2290.

[26] Birkel, C. S.; Zeier, W. G.; Douglas, J. E.; Lettiere, B. R.; Mills, C. E.; Seward, G.; Birkel, A.; Snedaker, M. L.; Zhang, Y.; Snyder, G. J.; Pollock, T. M.; Seshadri, R.; Stucky, G. D. Chem. Mater. 2012, 24, 2558-2565.

[27] Birkel, A.; Denault, K. A.; George, N. C.; Doll, C. E.; Hery, B.; Mikhailovsky, A. A.; Birkel, C. S.; Hong, B.-C.; Seshadri, R. Chem. Mater. 2012, 24, 1198-1204.

[28] Birkel, A.; Darago, L. E.; Morrison, A.; Lory, L.; George, N. C.; Mikhailovsky, A. A.; Birkel, C. S.; Seshadri, R. Solid State Sci. 2012, 14, 739-745.

[29] Ishigaki, T.; Mizushina, H.; Uematsu, K.; Matsushita, N.; Yoshimura, M.; Toda, K.; Sato, M. Mater. Sci. Eng., B 2010, 173, 109-112.

[30] Chen, H.-Y.; Weng, M.-H.; Chang, S.-J.; Yang, R.-Y. Ceram. Int. 2012, 38, 125-130.

[31] Le Bail, A.; Duroy, H.; Fourquet, J. Mater. Res. Bull. 1988, 23, 447-452.

[32] Coelho, A. A. Topas Academic V4.1. Software, Coelho Software, Brisbane (Australia), 2007.

[33] Greenham, N. C.; Samuel, I. D. W.; Hayes, G. R.; Phillips, R. T.; Kessener, Y. A. R. R.; Moratti, S. C.; Holmes, A. B.; Friend, R. H. Chem. Phys. Lett. 1995, 241, 89-96.

[34] Becker, W. Advanced Time-Correlated Single Photon Counting Techniques; Springer Series in Chemical Physics; Springer: Berlin, Heidelberg, New York, 2005; Vol. 81.

[35] Birkel, A.; DeCino, N. A.; George, N. C.; Hazelton, K. A.; Hong, B.-C.; Seshadri, R. Solid State Sci. 2013, 19, 51-57.

[36] Ma, L.; Wang, D.-J.; Mao, Z.-Y.; Lu, Q.-F.; Yuan, Z.-H. Appl. Phys. Lett. 2008, 93, 144101.

[37] Wang, D.-J.; Liu, L.-Y. Electrochem. Solid St. 2009, 12, H179.

[38] Dorenbos, P. J. Lumin. 2000, 91, 91-106.

[39] Dorenbos, P. J. Phys.: Condens. Matter 2003, 15, 4797-4807.

[40] Dorenbos, P. J. Lumin. 2003, 104, 239-260.

[41] Blasse, W.; Grabmaier, B. C. Luminescent Materials; Springer: Berlin, Heidelberg, New York, 1994.

[42] Bachmann, V.; Ronda, C.; Meijerink, A. Chem. Mater. 2009, 21, 2077-2084.

[43] Daldosso, M.; Falcomer, D.; Speghini, A.; Ghigna, P.; Bettinelli, M. Opt. Mater. 2008, 30, 1162-1167.

[44] Poort, S. H. M.; Meyerink, A.; Blasse, G. J. Phys. Chem. Solids 1997, 58, 1451-1456.

[45] Paulose, P. I.; Jose, G.; Thomas, V.; Unnikrishnan, N. V.; Warrier, M. K. R. J. Phys. Chem. Solids 2003, 64, 841-846.

[46] Rack, P. D.; Holloway, P. H. Mater. Sci. Eng., R 1998, 21, 171-219.

[47] Dorenbos, P. J. Phys.: Condens. Matter 2005, 17, 8103-8111.

[48] Im, W. B.; Kim, Y.-I.; Yoo, H. S.; Jeon, D. Y. Inorg. Chem. 2009, 48, 557-64.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A composition of matter, comprising:
a phosphor having an emission peak in each of a blue, green, and red color region of the Electromagnetic spectrum, wherein:
the phosphor is excitable by light having a wavelength between 350 nanometers (nm) and 420 nm, and
the phosphor comprises a crystal phase having a chemical composition represented by the formula:

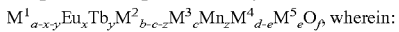, wherein:

$M^1$ is at least one metal element selected from Ca, Sr and Ba,
$M^2$ is Mg, $M^3$ is at least one metal element selected from Li and Na,
$M^4$ is at least one element selected from the group 14 of the Periodic table,
$M^5$ is at least one element selected from the group 13 of the Periodic table,
$2.7 \leq a \leq 3.3$,
$0.7 \leq b \leq 1.3$,
$0 < c \leq 1.0$,
$1.7 \leq d \leq 2.3$,
$0 \leq e \leq 1.0$,
$7.7 \leq f \leq 8.3$,
$0 < x < 0.3$,
$0 < y < 0.9$, and
$0 < z < 0.4$.

2. The composition of matter according to claim 1, wherein the blue emission peak is at a wavelength between 430 nm and 470 nm.

3. The composition of matter according to claim 1, wherein the green emission peak is at a wavelength between 520 nm and 560 nm.

4. The composition of matter according to claim 1, wherein the red emission peak is at a wavelength between 600 nm and 660 nm.

5. The composition of matter according to claim 1, wherein $M^1$ is Ba, $M^3$ is Li, and $M^4$ is Si.

6. The composition of matter of claim 1, wherein the phosphor further comprises:
a crystal doped with at least three dopants and comprising one or more charge balancing members surrounding one or more of the dopants, wherein the charge balancing members split the crystal's electric or ligand field experienced by the dopants such that the dopants emit light having the emission peak in each of the blue, green, and red color region;
relative amounts of each of the dopants, wherein radiative interactions between the dopants are suppressed such that the emission peak has a color temperature; and
a single phase.

7. The composition of matter of claim 1, wherein the phosphor emits white light having a color temperature.

8. The composition of matter of claim 7, wherein the color temperature is between 2500 Kelvin and 20000 Kelvin.

9. The composition of matter of claim 8, wherein the phosphor comprises a content of Eu, Tb and Mn wherein the color temperature is between 2500 Kelvin and 20000 Kelvin.

10. The composition of matter of claim 8, wherein a relative amount of dopants in the phosphor is such that the color co-ordinate of the emission peak is no more than ($\Delta x=0.01$, $\Delta y=0.1$) from a color coordinate of ($x=0.33$, $y=0.33$) or Plankian locus.

11. A composition of matter, comprising:
a phosphor having an emission peak in each of a blue, green and red color region of the Electromagnetic spectrum, wherein:

the phosphor is excitable by light having a wavelength between 350 nanometers (nm) and 420 nm, the phosphor is barium magnesium silicate, strontium magnesium silicate, or calcium magnesium silicate, the phosphor is doped with Europium, Terbium, and Manganese and the phosphor further comprises lithium or sodium for charge balancing the dopants.

12. The composition of matter of claim 11, wherein the dopants include:

a concentration of $Eu^{2+}$ of 1 to 3 mol %, a $Tb^{3+}$ concentration of 8 to 12 mol %, and an $Mn^{2+}$ concentration in a range of 2-3%.

13. The composition of matter of claim 11, wherein the dopants include:

a concentration of $Eu^{2+}$ of 0.1 to 5 mol %, a $Tb^{3+}$ concentration of 0.1 to 15 mol %, and an $Mn^{2+}$ concentration in a range of 0.1 to 5 mol %.

14. A method of fabricating a phosphor, comprising:

mixing raw materials in liquid form, in solution, or in a sol gel form; and heating the mixed raw materials, including the heating of the mixed raw materials by microwave;

under synthesis conditions to make a phosphor having an emission peak in each of a blue, green, and red color region of the Electromagnetic spectrum, wherein the phosphor is excitable by light having a wavelength between 350 nanometers (nm) and 420 nm; a wherein the heating and mixing are such that the phosphor comprises a crystal phase having a chemical composition represented by the formula:

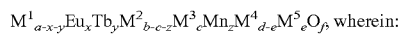
$M^1_{a-x-y}Eu_xTb_yM^2_{b-c-z}M^3_cMn_zM^4_{d-e}M^5_eO_f$, wherein:

$M^1$ is at least one metal element selected from Ca, Sr and Ba, $M^2$ is Mg, $M^3$ is at least one metal element selected from Li and Na, $M^4$ is at least one element selected from the group 14 of the Periodic table, $M^5$ is at least one element selected from the group 13 of the Periodic table, $2.7 \leq a \leq 3.3$, $0.7 \leq b \leq 1.3$, $0 < c \leq 1.0$, $1.7 \leq d \leq 2.3$, $0 \leq e \leq 1.0$, $7.7 \leq f \leq 8.3$, $0 < x < 0.3$, $0 < y < 0.9$, and $0 < z < 0.4$.

15. The method of claim 14, wherein the mixing and heating are such that the emission peak has a color temperature between 2500 Kelvin and 20000 Kelvin.

16. The method of claim 14, wherein:

the mixing comprises:

incorporating relative amounts of dopants, and including one or more charge balancing members; and the heating comprises heating the mixed raw materials under conditions; wherein:

the mixed raw materials crystallize into the phosphor having a single phase;

the charge balancing members split the phosphor's electric or ligand field experienced by the dopants such that the dopants have an emission peak in each of the blue, green, and red color region when the phosphor is excited by the light; and the relative amounts suppress radiative interactions between the dopants such that the emission peak has a color temperature.

17. The method of claim 16, wherein the mixed raw materials are mixed in the sol gel form and the charge balancing members are Lithium ions.

18. The method of claim 16, wherein the relative amounts of the dopants in the phosphor are such that a color co-ordinate of the emission peak is no more than ($\Delta x=0.01$, $\Delta y=0.1$) from a color coordinate of (x=0.33, y=0.33) or from a Plankian locus.

19. The method of claim 16, wherein the dopants are Eu, Tb and Mn and further comprising selecting the Eu, Tb and Mn contents to control the color temperature between 2500 Kelvin and 20000 Kelvin.

20. A semiconductor light emitting device comprising the composition of matter of claim 1, comprising:

a solid state light emitting device to emit light in an ultraviolet region; and the phosphor optically coupled to the solid state light emitting device, wherein the phosphor comprises a full color emitting phosphor having the emission peak in each of the blue, the green, and the red color region of the Electromagnetic spectrum, when excited by the solid state light emitting device.

* * * * *